(12) United States Patent
Rajski et al.

(10) Patent No.: US 8,301,945 B2
(45) Date of Patent: Oct. 30, 2012

(54) DECOMPRESSORS FOR LOW POWER DECOMPRESSION OF TEST PATTERNS

(75) Inventors: Janusz Rajski, West Linn, OR (US); Grzegorz Mrugalski, Wilsonville, OR (US); Dariusz Czysz, Poznan (PL); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/225,240

(22) Filed: Sep. 2, 2011

(65) Prior Publication Data

US 2011/0320999 A1 Dec. 29, 2011

Related U.S. Application Data

(62) Division of application No. 12/641,150, filed on Dec. 17, 2009, now Pat. No. 8,015,461, which is a division of application No. 11/880,192, filed on Jul. 19, 2007, now Pat. No. 7,647,540.

(60) Provisional application No. 60/832,690, filed on Jul. 21, 2006.

(51) Int. Cl.
 *G01R 31/28* (2006.01)
(52) U.S. Cl. .................................. 714/729; 714/734
(58) Field of Classification Search .................. 714/726, 714/728, 729, 738, 733, 734
See application file for complete search history.

(56) References Cited

U.S. PATENT DOCUMENTS

| | | | |
|---|---|---|---|
| 5,831,992 A | 11/1998 | Wu | |
| 5,991,909 A | 11/1999 | Rajski et al. | |
| 6,256,760 B1 | 7/2001 | Carron et al. | |
| 6,327,687 B1 | 12/2001 | Rajski et al. | |
| 6,353,842 B1 | 3/2002 | Rajski et al. | |
| 6,501,288 B1 | 12/2002 | Wilsher | |
| 6,543,030 B1 | 4/2003 | Rajski et al. | |
| 6,557,129 B1 | 4/2003 | Rajski et al. | |
| 6,684,358 B1 | 1/2004 | Rajski et al. | |
| 6,874,109 B1 | 3/2005 | Rajski et al. | |
| 6,950,974 B1 | 9/2005 | Wohl et al. | |
| 6,993,694 B1 * | 1/2006 | Kapur et al. | 714/733 |
| 7,155,648 B2 | 12/2006 | Jas et al. | |
| 7,178,078 B2 * | 2/2007 | Hiraide et al. | 714/739 |
| 7,412,637 B2 | 8/2008 | Wang et al. | |
| 7,484,151 B2 | 1/2009 | Balakrishnan et al. | |
| 7,512,851 B2 | 3/2009 | Wang et al. | |
| 7,558,996 B2 | 7/2009 | Kiryu | |
| 7,647,540 B2 | 1/2010 | Rajski et al. | |
| 7,734,973 B2 * | 6/2010 | Hiraide et al. | 714/729 |
| 7,797,603 B2 | 9/2010 | Rajski et al. | |
| 8,015,461 B2 | 9/2011 | Rajski et al. | |

(Continued)

OTHER PUBLICATIONS

Benware et al., "Impact of Multiple-Detect Test Patterns on Product Quality," *Proc. ITC*, pp. 1031-1040 (2003).

(Continued)

*Primary Examiner* — Cynthia Britt
(74) *Attorney, Agent, or Firm* — Klarquist Sparkman, LLP

(57) ABSTRACT

Disclosed below are representative embodiments of methods, apparatus, and systems used to generate test patterns for testing integrated circuits. Embodiments of the disclosed technology can be used to provide a low power test scheme and can be integrated with a variety of compression hardware architectures (e.g., an embedded deterministic test ("EDT") environment). Certain embodiments of the disclosed technology can reduce the switching rates, and thus the power dissipation, in scan chains with no hardware modification. Other embodiments use specialized decompression hardware and compression techniques to achieve low power testing.

20 Claims, 16 Drawing Sheets

U.S. PATENT DOCUMENTS

| | | |
|---|---|---|
| 2003/0120988 A1 | 6/2003 | Rajski et al. |
| 2004/0128599 A1 | 7/2004 | Rajski et al. |
| 2004/0148554 A1 | 7/2004 | Dervisoglu et al. |
| 2005/0081130 A1 | 4/2005 | Rinderknecht et al. |
| 2006/0095818 A1 | 5/2006 | Bratt et al. |
| 2006/0236176 A1 | 10/2006 | Alyamani et al. |
| 2008/0052578 A1 | 2/2008 | Rajski et al. |
| 2008/0052586 A1 | 2/2008 | Rajski et al. |
| 2010/0138708 A1 | 6/2010 | Rajski et al. |
| 2010/0306609 A1 | 12/2010 | Rajski et al. |

OTHER PUBLICATIONS

Bonhomme et al., "A Gated Clock Scheme for Low Power Scan Testing of Logic ICs or Embedded Cores," *Proc. ATS*, pp. 253-258 (2001).
Bonhomme et al., "Power Driven Chaining of Flip-flops in Scan Architectures," *Proc. ITC*, pp. 796-803 (2002).
Butler et al., "Minimizing Power Consumption in Scan Testing: Pattern Generation and DFT Techniques," *Proc. ITC*, pp. 355-364 (2004).
Chakravarty et al., "Two Techniques for Minimizing Power Dissipation in Scan Circuits During Test Applications," *Proc. ATS*, pp. 324-329 (1994).
Chandra et al., "Combining Low-Power Scan Testing and Test Data Compression for System-on-a-Chip," *Proc. DAC*, pp. 166-169 (Jun. 2001).
Chandra et al., "Low-Power Scan Testing and Test Data Compression for System-on-a-Chip," *IEEE Trans. on Computer-Aided Design*, vol. 21, No. 5, pp. 597-604 (May 2002).
Chandra et al., "Reduction of SOC Test Data Volume, Scan Power and Testing Time Using Alternating Run-Length Codes," *Proc. DAC*, pp. 673-678 (2002).
Chiu et al., "Jump Scan: A DFT Technique for Low Power Testing," *VLSI Test Symp.*, pp. 277-282 (2005).
Chou et al., "Scheduling Tests of VLSI Systems Under Power Constraints," *IEEE Trans. VLSI*, vol. 5, No. 2, pp. 175-185 (Jun. 1997).
Czysz et al., "Low Power Embedded Deterministic Test," *VLSI Test Symp.*, 9 pp. (May 6-10, 2007).
Gerstendörfer et al., "Minimized Power Consumption for Scan-Based BIST," 8 pp. (also published as Gerstendörfer et al., "Minimized Power Consumption for Scan-Based BIST," *Proc. ITC*, pp. 77-84 (1999)).
Girard et al., "A Test Vector Inhibiting Technique for Low Energy BIST Design," 6 pp. (also published as Girard et al., "A Test Vector Inhibiting Technique for Low Energy BIST Design," *VLSI Test Symp.*, pp. 407-412 (1999)).
Girard et al., "High Defect Coverage with Low-Power Test Sequences in a BIST Environment," *IEEE Design & Test*, pp. 44-52 (2002).
Hertwig et al., "Low Power Serial Built-In Self-Test," *Proc. ETS*, pp. 49-53 (1998).
Huang et al., "A Token Scan Architecture for Low Power Testing," *Proc. ITC*, pp. 660-669 (2001).
Iyengar et al., "Precedence-Based Preemptive, and Power-Constrained Test Scheduling for System-on-Chip," 7 pp. (also published as Iyengar et al., "Precedence-Based Preemptive, and Power-Constrained Test Scheduling for System-on-Chip," *VLSI Test Symp.*, pp. 368-374 (2001)).
Jas et al., "Using an Embedded Processor for Efficient Deterministic Testing of System-on-a-Chip," *Proc. ICCD*, pp. 418-423 (1999).
Kajihara et al., "Test Vector Modification for Power Reduction during Scan Testing," *VLSI Test Symp.*, pp. 160-165 (2002).
Lee et al., "LFSR-Reseeding Scheme Achieving Low-Power Dissipation During Test," *IEEE Trans. on Computer-Aided Design*, vol. 26, No. 2, pp. 396-401 (Feb. 2007).
Lee et al., "Low Power Test Data Compression Based on LFSR Reseeding," 6 pp. (also published as Lee et al., "Low Power Test Data Compression Based on LFSR Reseeding," *Proc. ICCD*, pp. 180-185 (2004)).

Mrugalski et al., "New Test Data Decompressor for Low Power Applications," *Proc. DAC*, 6 pp. (Jun. 4-8, 2007).
Mrugalski et al., "Ring Generators—New Devices for Embedded Test Applications," *IEEE Trans. on Computer-Aided Design*, vol. 23, No. 9, pp. 1306-1320 (Sep. 2004).
Office action dated May 22, 2009, from U.S. Appl. No. 11/880,192.
Rajski et al., "Embedded Deterministic Test," *IEEE Trans. on Computer-Aided Design*, vol. 23, No. 5, pp. 776-792 (May 2004).
Rajski et al., "Modular Logic Built-In Self-Test for IP Cores," *IEEE Int'l Test Conf.*, pp. 313-321 (Oct. 1998).
Rajski et al., "Test Data Decompression for Multiple Scan Designs with Boundary Scan," *IEEE Trans. on Computers*, vol. 47, No. 11, pp. 1188-1200 (Nov. 1998).
Rajski et al., "X-Press Compactor for 1000x Reduction of Test Data," *Proc. ITC*, pp. 1-10 (Oct. 2006).
Remersaro et al., "Preferred Fill: A Scalable Method to Reduce Capture Power for Scan Based Designs," *Proc. ITC*, pp. 1-10 (Oct. 2006).
Rosinger et al., "Low Power Mixed-Mode BIST Based on Mask Pattern Generation Using Dual LFSR Re-Seeding," 6 pp. (also published as Rosinger et al., "Low Power Mixed-Mode BIST Based on Mask Pattern Generation Using Dual LFSR Re-seeding," *Proc. ICCD*, pp. 474-479 (2002)).
Sankaralingam et al., "Static Compaction Techniques to Control Scan Vector Power Dissipation," 6 pp. (also published as Sankaralingam et al., "Static Compaction Techniques to Control Scan Vector Power Dissipation," *VLSI Test Symp.*, pp. 35-40 (2000)).
Sankaralingam et al., "Reducing Power Dissipation During Test Using Scan Chain Disable," *VLSI Test Symp.*, pp. 319-324 (2001).
Sakaralingam et al., "Controlling Peak Power During Scan Testing," *VLSI Test Symp.*, pp. 153-159 (2002).
Saxena et al., "An Analysis of Power Reduction Techniques in Scan Testing," *Proc. ITC*, pp. 670-677 (2001).
Sinanoglu et al., "Test Power Reduction Through Minimization of Scan Chain Transitions," 6 pp. (also published as Sinanoglu et al., "Test Power Reduction Through Minimization of Scan Chain Transitions," *VLSI Test Symp.*, pp. 166-171 (2002)).
Wang et al., "An Automatic Test Pattern Generator for Minimizing Switching Activity During Scan Testing Activity," *IEEE Trans. on Computer-Aided Design*, vol. 21, No. 8, pp. 954-968 (Aug. 2002).
Wang et al., "ATPG for Heat Dissipation Minimization During Test Application," *IEEE Trans. Computers*, vol. 47, No. 2, pp. 256-262 (Feb. 1998).
Wang et al., "DS-LFSR: A BIST TPG for Low Switching Activity," *IEEE Trans. on Computer-Aided Design*, vol. 21, No. 7, pp. 842-851 (Jul. 2002).
Wang, "Generation of Low Power Dissipation and High Fault Coverage Patterns for Scan-Based BIST," *Proc. ITC*, pp. 834-843 (2002).
Wang et al., "LT-RTPG: A New Test-Per-Scan BIST TPG for Low Switching Activity," *IEEE Trans. on Computer-Aided Design*, vol. 25, No. 8, pp. 1565-1574 (Aug. 2006).
Wen et al., "Low-Capture-Power Test Generation for Scan-Based At-Speed Testing," *Proc. ITC*, pp. 1-10 (2005).
Wen et al., "On Low-Capture-Power Test Generation for Scan Testing," *VLSI Test Symp.*, pp. 265-270 (2005).
Whetsel, "Adapting Scan Architectures for Low Power Operation," *Proc. ITC*, pp. 863-872 (2000).
Wohl et al., "Efficient Compression and Application of Deterministic Patterns in a Logic BIST Architecture," 10 pp. (also published as Wohl et al., "Efficient Compression and Application of Deterministic Patterns in a Logic BIST Architecture," *40th Design Automation Conference*, pp. 566-575 (2003)).
Zoellin et al., "BIST Power Reduction Using Scan-Chain Disable in the Cell Processor," *Proc. ITC*, pp. 1-8 (Oct. 2006).
Krishna et al., "Adjustable Width Linear Combinational Scan Vector Decompression," *IEEE Int'l Conf. on Computer Aided Design, 2003. ICCAD-2003*, pp. 863-866 (Nov. 2003).

\* cited by examiner

800 ↘
```
1101011110001001010100010011 0101
0110101111000101101110001001 1010
1001101011110000011111100010 0110
0010011010111100100101111000 1001
1111000100110101110001101011 1100
0111100010011011111100110101 1110
********************************
```
FIG. 8
900 ↘
```
0000000011000000010111111111 1111
0000000001111111101111111111 1111
0000000000000000011111111111 1111
0000000010111111100111111111 1111
0000000001111111100000000000 0000
0000000011111111111111111111 1111
   ***        ***
```
FIG. 9
1000 ↘
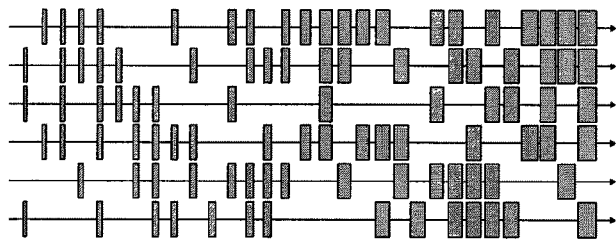
FIG. 10
1100 ↘
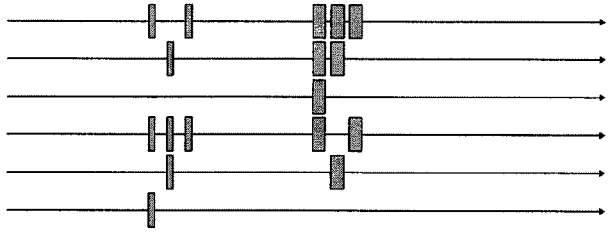
FIG. 11

DECOMPRESSORS FOR LOW POWER DECOMPRESSION OF TEST PATTERNS

CROSS-REFERENCE TO RELATED APPLICATION

This application is a divisional of U.S. patent application Ser. No. 12/641,150, filed Dec. 17, 2009, now U.S. Pat. No. 8,015,461 which is a divisional of U.S. patent application Ser. No. 11/880,192, filed Jul. 19, 2007, now U.S. Pat. No. 7,647,540 which claims the benefit of U.S. Provisional Application No. 60/832,690, filed Jul. 21, 2006, all of which are hereby incorporated herein by reference.

TECHNICAL FIELD

This application relates generally to the field of test pattern generation as may be used, for example, to test one or more integrated circuits.

BACKGROUND

Design-for-testability ("DFT") techniques based on scan and automatic test pattern generation ("ATPG") are commonly used as part of integrated circuit manufacturing to provide very high test coverage. For large circuits, however, the volume of test data required to test such circuits can cause a significant increase in test time and tester memory requirements. In order to cope with these challenges, various test data reduction schemes have been introduced. Some test data reduction schemes, for example, use on-chip decompression and compression hardware. By using such hardware, a tester can deliver test patterns in a compressed form, and the on-chip decompressor can expand (or decompress) the compressed test patterns into the actual data loaded into scan chains. The latter operation is possible because typically only a small number of bits in the decompressed test patterns are specified bits designed to target one or more specific faults in the integrated circuit. The remaining unspecified bits of the decompressed test pattern commonly comprise "don't care" bits and are randomly determined as a result of the decompressor structure. The high number of randomly filled test pattern bits, however, can cause excessive switching in the scan cells of the scan chains. This, in turn, often leads to undesirably high power consumption during the test procedure. Such power consumption can result in overheating or supply voltage noise—either of which can cause a device to malfunction, its permanent damage, or reliability degradation due to accelerated electro-migration. Accordingly, improved methods for generating test patterns that reduce the amount of power consumed during testing are desired.

SUMMARY

Disclosed below are representative embodiments of methods, apparatus, and systems used to generate test patterns for testing integrated circuits. Embodiments of the disclosed technology can be used to provide a low power test scheme and can be integrated with a variety of compression hardware architectures (e.g., an embedded deterministic test ("EDT") environment). Certain embodiments of the disclosed technology can reduce the switching rates, and thus the power dissipation, in scan chains with no hardware modification. Other embodiments use specialized decompression hardware and compression techniques to achieve low power testing.

Experimental results confirm that for industrial circuits with test cubes having very low fill rates, exemplary implementations of the disclosed technology result in a reduction of test power (e.g., a 10 times reduction in power) as well as an increase in the actual test data compression ratio (e.g., by a factor of 5).

In one exemplary disclosed embodiment, one or more specified test pattern values of a test pattern are determined. The specified test pattern values target one or more faults in an integrated circuit and are associated with respective scan chain shift cycles. A self-loop state of a decompressor is assigned to one or more of the scan chain shift cycles having one or more associated specified test pattern values. In this embodiment, the assigned self-loop state corresponds to an operational state of the decompressor in which the decompressor produces values that are compatible with the associated specified test pattern values in the one or more scan chain shift cycles and that are reproducible by the decompressor over consecutive scan chain shift cycles. One or more decompressor input values that cause the decompressor to operate in the assigned self-loop state during the two or more scan chain shift cycles are determined and stored in one or more computer-readable media. In certain implementations, the self-loop state of the decompressor is assigned to one or more scan chain shift cycles having no associated specified test pattern values. The scan chain shift cycles having no associated specified test pattern values can be between two scan chain shift cycles having associated specified test pattern values. The scan chain shift cycles having no associated specified test pattern values can also be before a first scan chain shift cycle of the test pattern having one or more associated specified test pattern values, or after a last scan chain shift cycle of the test pattern having associated specified test pattern values. In particular implementations, the act of determining one or more decompressor input values comprises solving linear equations representative of at least some of the specified test pattern values. In some implementations, the act of solving the linear equations comprises using Gauss-Jordan elimination techniques.

In another exemplary embodiment disclosed herein, a test cube of test pattern values is generated. The test pattern values of this embodiment comprise specified bits and unspecified bits, and the test cube is divisible into a plurality of test cube slices, each test cube slice being associated with a corresponding shift cycle and comprising a respective subset of the test pattern values. A self-loop state of a decompressor is assigned to a first test cube slice comprising at least one of the specified bits. An evaluation is made to as to whether the values produced by the decompressor in the self-loop state assigned to the first test cube conflict with specified bits of a second test cube slice, the second test cube slice being associated with a shift cycle occurring after the shift cycle of the first test cube slice and comprising at least another one of the specified bits. The self-loop state is assigned to the second test cube slice if the values produced by the decompressor in the self-loop state assigned to the first test cube slice do not conflict with the specified bits of the second test cube slice. The assignment of the self-loop state to the first test cube slice and the second test cube slice can be stored. In particular implementations, the self-loop state of the decompressor assigned to the first test cube slice is a first self-loop state. In such implementations, a second self-loop state of the decompressor can be assigned to the second test cube slice if the values produced by the decompressor in the self-loop state assigned to the first test cube slice do conflict with the specified bits of the second test cube slice. In some implementations, the self-loop state of the decompressor assigned to the first test cube slice corresponds to an operating state of the decompressor in which the decompressor produces values that do not conflict with the specified bits of the first test cube slice and produces values that are reproducible by the decompressor over consecutive clock cycles. In some implementations, the self-loop state is assigned to one or more other test cube slices, thereby forming a cluster of consecutive test cube slices assigned to the self-loop state. At least some of the one or more other test cube slices can have no specified bits. The one or more other test cube slices can also include test cube slices between the first test cube slice and the second test cube slice. In some implementations, one or more decompressor input values are determined that cause the decompressor to enter the self-loop state during at least some of the shift cycles of the test cube slices assigned to the self-loop state. The act of determining the one or more decompressor input values can, in certain implementations, comprise solving linear equations representing the specified bits in the cluster of consecutive test cube slices. In certain implementations, the linear equations can represent the specified bits as occurring in a first test cube slice of the cluster. Additionally, in some implementations, the linear equations can represent all specified bits in the cluster of consecutive test cube slices, the cluster of consecutive test cube slices can be a first cluster, and the act of determining the one or more decompressor input values can further include forming a second cluster of consecutive test cube slices (for example, comprising a subset of the consecutive test cube slices from the first cluster) if the linear equations representing the specified bits in the first cluster of consecutive test cubes slices cannot be solved, and solving linear equations representing the specified bits in the second cluster of consecutive test cube slices.

Another disclosed embodiment comprises one or more computer-readable media storing a compressed test pattern. In this embodiment, the compressed test pattern includes compressed test pattern values that cause a decompressor to produce identical output values over two or more decompressor clock cycles. The output values of this embodiment include at least some values that target a selected fault in an integrated circuit design. Furthermore, the compressed test pattern values can comprise a first set of compressed test pattern values, the identical output values can comprise a first set of identical output values, and the two or more decompressor clock cycles can comprise a first set of decompressor clock cycles. In such instances, the compressed test pattern can further include a second set of compressed test pattern values that causes the decompressor to produce a second set of identical output values over two or more different consecutive decompressor clock cycles. In certain implementations, the second set of compressed test pattern bits immediately follows the first set of compressed test pattern values in the compressed test pattern.

In another exemplary embodiment disclosed herein, compressed test pattern bits are input into one or more decompressor inputs during two or more clock cycle, and decompressed test pattern bits are output from two or more decompressor outputs during the two or more clock cycles. In some implementations, each respective decompressor output outputs identical decompressed test pattern bits during the two or more clock cycles, and only a portion of the decompressed test pattern bits output from the two or more decompressor outputs are specified test pattern bits that target one or more faults in the circuit-under-test. In certain implementations, the act of inputting the compressed test pattern bits comprises causing the decompressor to enter a self-loop state. The decompressor in this embodiment can comprise a linear feedback shift register (for example, a ring generator) coupled to a phase shifter. In certain implementations, the compressed test pattern bits are output from a tester external to the circuit-under-test.

In another disclosed embodiment, a test cube of test pattern values comprising specified bits and unspecified bits is generated. The test cube can be divided into a plurality of test cube slices, each test cube slice being associated with a corresponding shift cycle and comprising a respective subset of the test pattern values. In this embodiment, an operational state of a decompressor state machine is determined in which the decompressor produces values that are identical in value and scan chain location to the specified bits in two or more of the test cube slices. A compressed test pattern that causes the decompressor state machine to enter the operational state is also determined. Control values for causing a register coupled to the decompressor state machine to load the values from the decompressor state machine when the decompressor state machine enters the operational state are also determined. The compressed test pattern and the control values can be stored in one or more computer-readable media. In particular implementations, the decompressor state machine is a ring generator or linear feedback shift register. Further, the act of determining the compressed test pattern can comprise solving linear equations representing the specified bits from the two or more of the test cube slices. The two or more of the test cube slices can form part of a cluster of consecutive test cube slices, and the act of determining the compressed test pattern can further comprise adding new linear equations from additional test cube slices for so long as the linear equations are solvable, thereby incrementally increasing the size of the cluster. Similarly, the two or more test cube slices can form part of a cluster of consecutive test cube slices, and the linear equations can represent the specified bits of the cluster as if they were in a first test cube slice of the cluster.

In another disclosed embodiment, a test cube of test pattern values is generated, wherein the test pattern values comprise specified bits and unspecified bits. The test cube of this embodiment can be divided into a plurality of test cube slices, each test cube slice being associated with a corresponding shift cycle and comprising a respective subset of the test pattern values. An operational state of a decompressor state machine that produces values that are identical in value and scan chain location to the specified bits of two or more of the test cube slices can be determined. A compressed test pattern that causes the decompressor state machine to enter the operational state and that creates control values for causing a register coupled to the decompressor state machine to load the values from the decompressor state machine when the decompressor state machine enters the operational state can also be determined. The compressed test pattern can be stored in one or more computer-readable media. In particular implementations, the decompressor state machine is a ring generator or linear feedback shift register. In some implementations, the act of determining the compressed test pattern comprises solving linear equations. The linear equations can represent the specified bits from the two or more of the test cube slices. The linear equations can further represent the control values. In particular implementations, the two or more of the test cube slices form part of a cluster of consecutive test cube slices, and the act of determining the compressed test pattern further comprises adding new linear equations from additional test cube slices for so long as the linear equations are solvable, thereby incrementally increasing the size of the cluster. In some implementations, the two or more test cube slices form part of a cluster of consecutive test cube slices, and the linear equations represent the specified bits of the cluster and the control bits for each of the test cube slices as if they were in a first test cube slice of the cluster.

In another disclosed embodiment, compressed test pattern bits are input. Decompressed test pattern bits are generated from the compressed test pattern bits. The decompressed test pattern bits are stored in one or more registers. The scan chains of a circuit-under-test are loaded with the decompressed test pattern bits stored in the one or more registers. In particular implementations, the loading is performed for two or more scan chain shift cycles such that the decompressed test pattern bits stored in the one or more registers are repeatedly loaded into the scan chain. In some implementations, the compressed test pattern bits are a first set of compressed test pattern bits, the decompressed test pattern bits are a first set of decompressed test pattern bits, and the method further comprises inputting a second set of compressed test pattern bits, generating a second set of decompressed test pattern bits from the second set of compressed test pattern bits, and storing the second set of decompressed test pattern bits in the one or more registers, thereby replacing the first set of decompressed test pattern bits in the one or more registers. In some implementations, the two or more scan chain shift cycles comprise a first set of two or more scan chain shift cycles, and the method further comprises loading the scan chains of the circuit-under-test with the second set of decompressed test pattern bits stored in the one or more registers, the loading being performed for a second set of two or more scan chain shift cycles such that the second set of decompressed test pattern bits are repeatedly loaded into the scan chain. The two or more scan chain shift cycles can be, for example, consecutive scan chain shift cycles. Furthermore, in certain embodiments, the one or more registers are one or more shadow registers. Still further, the one or more registers may be coupled to one or more phase shifters. In some embodiments, the compressed test pattern bits are output from a tester external to the circuit-under-test.

Another disclosed embodiment is an apparatus comprising a linear finite state machine (LFSM) having two or more LFSM outputs and one or more LFSM inputs. The apparatus further comprises a register having two or more register inputs and two or more register outputs, the two or more register inputs being respectively coupled to the two or more LFSM outputs. The apparatus also comprises a phase shifter comprising two or more phase shifter inputs and two or more phase shifter outputs, the two or more phase shifter inputs being respectively coupled to the two or more register outputs. The apparatus can further comprise a control channel coupled to a clock input of the register. For example, the control channel can be coupled to the clock input of the register via a logic gate (for example, an AND gate). In some implementations, the control channel receives input from a single pin of the circuit-under-test. In other implementations, the control channel is coupled to one or more logic gates, the logic gates being coupled to one or more test data inputs of the circuit-under-test. The logic gates of this implementation can form, for example, an XOR network. In some implementations, the LFSM is a linear feedback shift register (LFSR) or a ring generator. In certain implementations, the register is a first register, and the apparatus further comprising a second register comprising two or more second register inputs and two or more second register outputs, the two or more second register inputs being respectively coupled to two or more additional LFSM outputs, and the two or more second register outputs being respectively coupled to two or more additional phase shifter inputs. In other implementations, the register is a first register, the phase shifter is a first phase shifter, and the apparatus further comprises a second register comprising two or more second register inputs and two or more second register outputs, the two or more second register inputs being respectively coupled to two or more additional LFSM outputs, and a second phase shifter comprising two or more second phase shifter inputs and two or more second phase shifter outputs, the two or more second phase shifter inputs being respectively coupled to the two or more second register outputs.

Any of the disclosed embodiments can be performed in a variety of environments, including a simulation environment. Further, any of the disclosed methods can be implemented as computer-readable media comprising computer-executable instructions for causing a computer to perform the methods. Any of the disclosed methods implemented in a computer environment can also be performed by a single computer or via a network. Further, computer-readable media storing test patterns or test pattern values (or any other final or intermediate results) produced by any of the disclosed methods are also disclosed.

The foregoing and other objects, features, and advantages of the invention will become more apparent from the following detailed description, which proceeds with reference to the accompanying figures.

BRIEF DESCRIPTION OF THE DRAWINGS

FIG. 8 is a diagram of a test pattern corresponding to the test cube of FIG. 7 and generated by a random fill procedure.

FIG. 9 is a diagram of a test pattern corresponding to the test cube of FIG. 7 and generated using an embodiment of the disclosed low power decompression technology.

FIG. 10 is a representation illustrating the power consumption associated with the test pattern of FIG. 8.

FIG. 11 is a representation illustrating the power consumption associated with the test pattern of FIG. 9.

FIG. 15 is a diagram of a test pattern corresponding to the test cube of FIG. 7 and generated by a random fill procedure.

FIG. 16 is a diagram of a test pattern corresponding to the test cube of FIG. 7 generated using an embodiment of a low power decompressor as disclosed herein.

DETAILED DESCRIPTION

General Considerations

Figure 1:
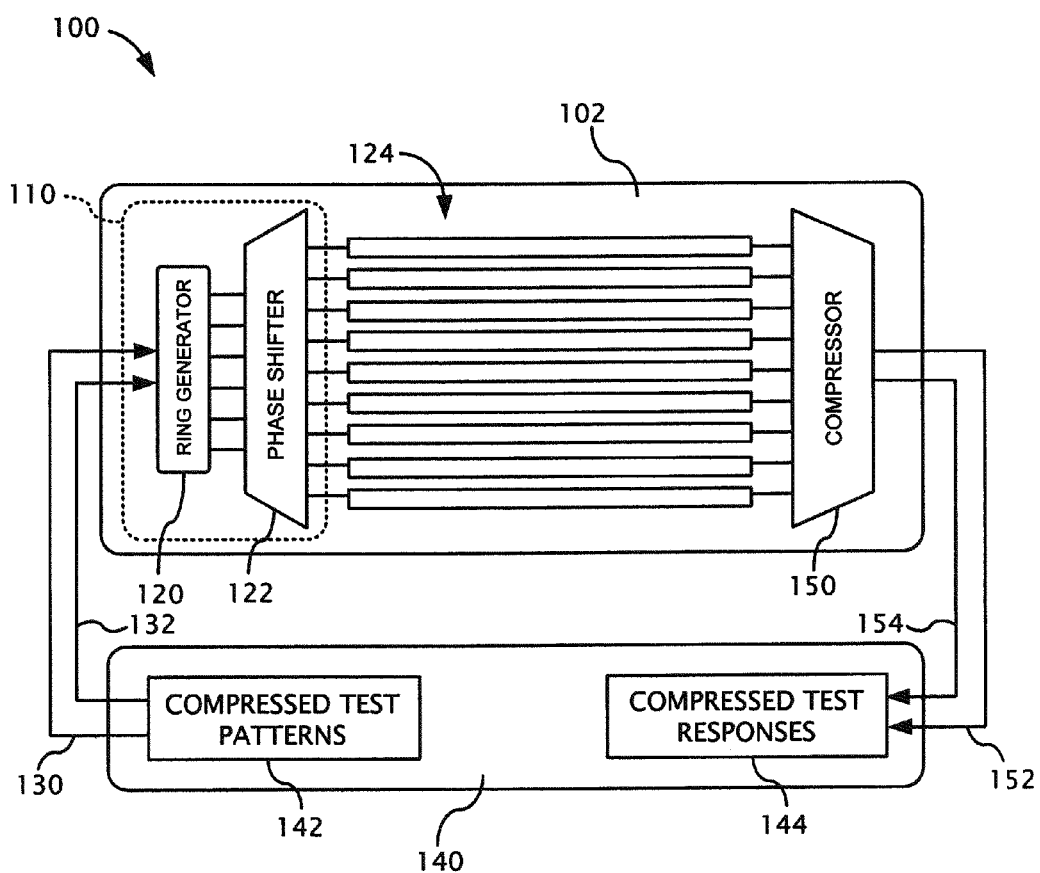
FIG. 1 is a schematic block diagram of an exemplary testing system as can be used in connection with embodiments of the disclosed technology.

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

The disclosed methods, apparatus, and systems should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "evaluate" and "determine" to describe the disclosed methods. These terms are high-level abstractions of the actual operations that are performed. The actual operations that correspond to these terms may vary depending on the particular implementation and are readily discernible by one of ordinary skill in the art.

The disclosed embodiments can be used to generate test patterns for testing a wide variety of scan-based or partially-scan-based circuits (for example, application-specific integrated circuits ("ASICs") (including mixed-signal ASICs), systems-on-a-chip ("SoCs"), or programmable logic devices ("PLDs"), such as field programmable gate arrays ("FPGAs")). The disclosed decompression hardware can also be implemented in any such circuits.

Any of the disclosed techniques can be implemented in whole or in part by software comprising computer-executable instructions stored on computer-readable media (e.g., computer-readable media, such as one or more CDs, volatile memory components (such as DRAM or SRAM), or nonvolatile memory components (such as hard drives)). Such software can comprise, for example, electronic design automation ("EDA") software tools (e.g., an automatic test pattern generation ("ATPG") tool). The particular software tools described should not be construed as limiting in any way, however, as the principles disclosed herein are generally applicable to other software tools.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Further, any data produced from any of the disclosed methods (e.g., intermediate data, such as the self-loop state assignments, or final data, such as the compressed test patterns, resulting from some of the disclosed embodiments) can be created, updated, or stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created or updated at a local computer or over a network (e.g., by a server computer).

Any of the disclosed methods can also be performed in a computer simulation or other EDA environment (e.g., in a simulation environment where test patterns are simulated as being applied to representations of circuits). For example, the disclosed methods can be performed using circuit design information representative of a circuit-under-test and the associated decompression/compression hardware (for example, a netlist, HDL file (such as a Verilog or VHDL file), and the like) and stored on computer-readable media. For presentation purposes, however, the present disclosure sometimes refers to the circuit-under-test (including the various components of the circuit-under-test) and the associated decompression/compression hardware (including the various components of the hardware) by their physical counterparts (for example, scan chains, scan cells, ring generator, phase shifter, shadow register, and other such terms). It should be understood, however, that any such reference not only includes the physical components but also includes representations of such components as are used in simulation, automatic test pattern generation, or other such EDA environments.

Any of the disclosed apparatus can be described or represented as design data or design information stored on one or more computer-readable media. For example, any of the disclosed decompressors can be described or represented in an HDL file (such as a Verilog, VHDL, or register-transfer level file), a gate-level netlist, or other such EDA design file (e.g., a GDSII file or Oasis file).

Low Power Encoding Embodiments

Disclosed herein are embodiments of a scheme for reducing switching activity during scan-in shifting. The disclosed technology is mainly discussed in the context of an embedded deterministic test ("EDT") environment, though it should be understood that the principles described herein are not limited to this environment. For example, the low power test pattern generation techniques described herein can be used with other decompression schemes that involve encoding test cubes having specified bits and unspecified bits.

Certain embodiments of the disclosed technology require neither additional DFT logic nor modifications to the circuit-under-test. Instead, such embodiments provide a flexible test cube encoding scheme which, in conjunction with a suitable decompressor (e.g., a state-machine-based decompressor such as a ring-generator-based, linear-finite-state-machine-based, or linear-feedback-shift-register-based decompressor), allows one to generate test patterns that significantly reduce the transition count when the test patterns are fed into scan chains of the circuit-under-test.

FIG. 1 is a schematic block diagram 100 showing an exemplary test data decompressor 110 of an integrated circuit 102 as can be used in connection with embodiments of the disclosed technology. In this example, the test data decompressor 110 is an EDT decompressor, and the block diagram 100 shows a typical EDT environment. Other examples of EDT decompressors 110 and exemplary EDT environments that are suitable for use with the disclosed technology are described in, for example, U.S. Pat. Nos. 6,327,687; 6,353,842; 6,557,129; 6,684,358; 6,874,109; and U.S. Patent Application Publication No. 2003/0120988, all of which are hereby incorporated herein by reference.

In the embodiment illustrated in FIG. 1, the decompressor 110 comprises an r-bit ring generator 120 and an associated phase shifter 122 driving s scan chains 124. In general, the ring generator 120 comprises a linear feedback shift register implementing a primitive polynomial and having feedback lines that have been shifted to reduce the number of logic gates used to implement the generator and to reduce the maximum internal fanout with the generator. Examples of ring generators are described in further detail in U.S. Pat. No. 6,353,842 and G. Mrugalski et al, "Ring generators—new devices for embedded test applications," *IEEE Trans. CAD,* vol. 23, pp. 1306-1320, September 2004, which are hereby incorporated herein by reference. It should be understood that the ring generator 120 in FIG. 1 is shown for illustrative purposes only and can alternatively comprise any linear-finite-state-machine-based pattern generator that inputs compressed test pattern bits and outputs bits used to create the decompressed test pattern bits. For example, the ring generator 120 can alternatively comprise a linear feedback shift register ("LFSR") or linear cellular automata ("CA").

In certain embodiments, compressed test patterns are delivered to the decompressor 110 from a compressed test pattern memory 142 of a tester 140. In the illustrated embodiment, the compressed test pattern bits are delivered through c input channels (e.g., channels 130, 132) in a continuous manner. For example, in certain embodiments, a new c-bit vector is injected into the ring generator 120 every scan shift cycle, thereby causing the state of the ring generator to change from one state to another at each scan shift cycle. In other embodiments, however, the ring generator 120 is configured to input bits over multiple shift cycles before changing state. FIG. 1 also shows a compressor 150 that receives responses from the circuit-under-test after the test pattern loaded into the scan chains 124 has been launched into the functional logic (not shown) of the circuit-under-test and captured by the scan chains 124 during a capture cycle. The compressor 150 generates compressed test responses that are output from the integrated circuit 102 through d output channels (e.g., channels 152, 154). The compressed test responses can then be stored in a compressed test response memory 144 and evaluated (or diagnosed) to determine the presence (and, in some cases, the possible locations) of defects in the integrated circuit 102.

The amount of power dissipation caused by outputting decompressed test pattern bits from the decompressor 102 into the scan chains generally depends on the number of transitions that occur in the scan chains and other parts of the CUT during the scan chain loading operation. The resultant switching activity can be estimated using a weighted transition metric, which not only counts the number of invoked transitions in successive scan cells but also takes into account the relative positions of the transitions. In one illustrative form, the weighted transition metric is determined as follows: Let m be the length of a scan chain, and $T=b_m \ldots b_2 b_1$ represent a test vector with bit $b_k$ scanned-in before $b_{k+1}$. The normalized form of the metric can be defined as follows:

$$P = 2[m(m-1]^{-1} \sum_{i=1}^{m-1} (m-i)(b_i \oplus b_{i+1}) \tag{1}$$

The average scan power dissipated during application of a test set (comprising multiple test patterns) can be computed by summing up the results provided by Expression (1) over all scan chains and all test patterns of the test set.

With continuous flow decompression (such as is performed using a ring generator), a decompressor typically receives compressed data on its inputs and produces decompressed values at its outputs at substantially the same time the compressed data is received. Embodiments of continuous flow decompressors that are suitable for use with the disclosed technology are described, for example, in U.S. Published Patent Application No. 2003/0120988. The output values that are not used to target a specific fault in the circuit-under-test are typically generated randomly as part of the decompression process and referred to herein as "unspecified bits." This process of randomly filling the unspecified test pattern bits with output values is referred to herein as "random fill" and often causes undesirably high power consumption during the scan chain loading process. For example, for EDT-based decompression, power consumption during can chain loading is usually close to 50 percent. As an example, consider an industrial design with 100 scan chains, each 450 bits long, driven by a 64-bit EDT decompressor with 16 channels. After applying 8400 test patterns, the weighted transition metric was equal to 48.16%. Other similar results are shown in Table 2 below.

As with other decompression methods, EDT-based compression exploits the fact that test cubes (the arrangement of test patterns bits as they are stored within the scan chains of a circuit-under-test) frequently feature a large number of unspecified positions. The sparse occurrence of specified bits in a test cube also enables the successful encoding of the test cube even if the decompressor remains in a fixed state for more than a single clock cycle. By holding the decompressor in a fixed state over multiple shift cycles, identical data can be delivered to the scan chains, thereby reducing the total number of transitions that occur during the loading process. For purposes of this disclosure, the fixed states in which a decompressor may be held are referred to as "self-loop" (SL) states.

The term "self-loop state" refers to the common state-machine-diagram notation where an arrow points from a state that a state machine leaves and toward the next state of the machine. Thus, when a state-machine is held in the same state, the state-machine-diagram notation forms a loop.

Figure 2:
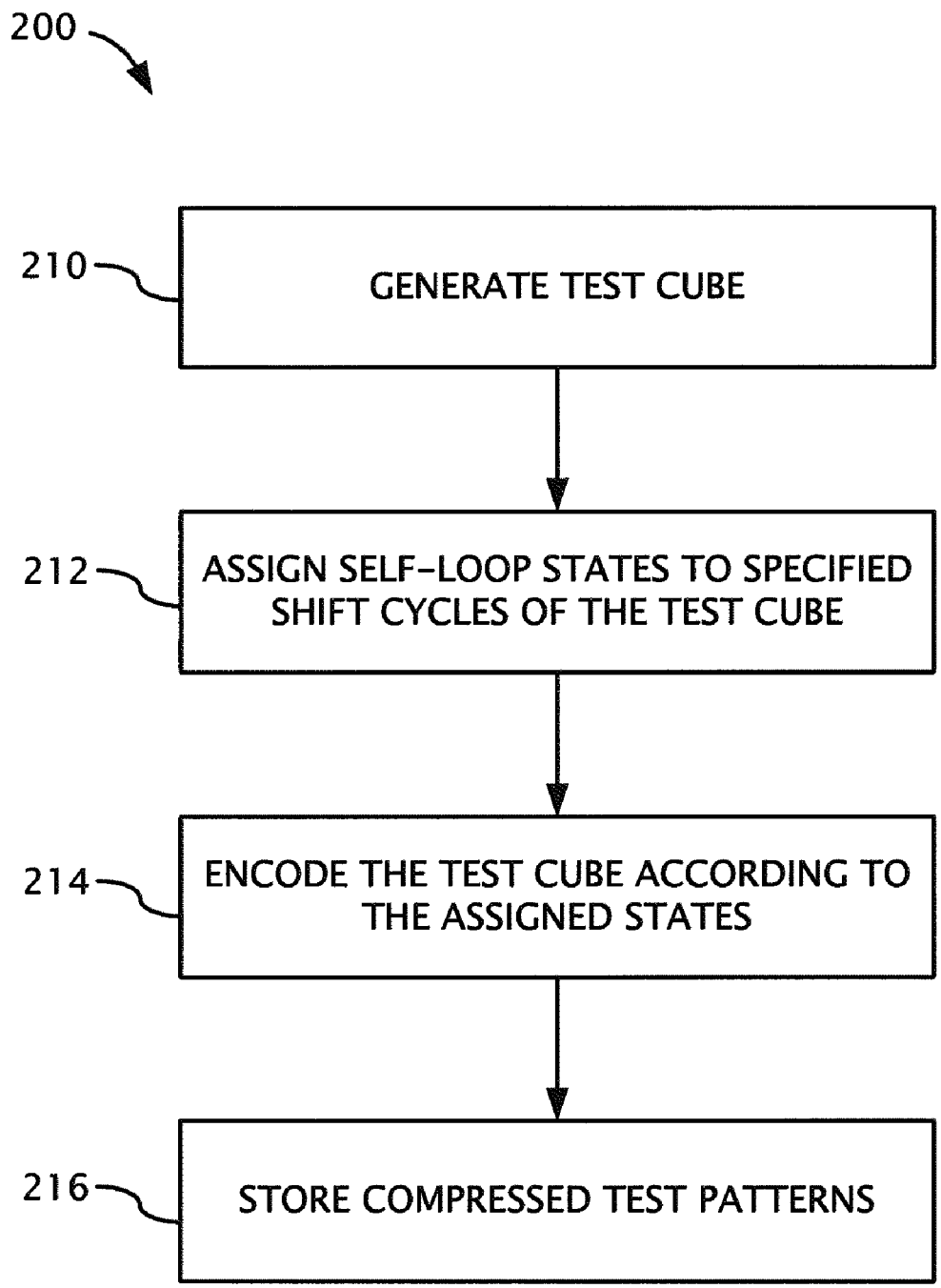
FIG. 2 is a flow chart of one illustrative procedure for determining compressed test patterns that cause a decompressor to generate low power test patterns.

FIG. 2 is a flow chart 200 of one illustrative procedure for determining compressed test patterns that cause a decompressor to generate low power test patterns. At process block 210, a test cube is generated. The test cube can be generated using a variety of well-known automated test pattern generation ("ATPG") techniques and can target a variety of possible faults (e.g., stuck-at faults, transition faults, and the like). The generated test cube typically comprises specified test pattern bits targeting one or more faults of the circuit-under-test and unspecified bits (the "don't care" bits).

At process block 212, the specified scan shift cycles of the test cube are assigned to an appropriate SL state of the decompressor, if possible. For example, a given SL state can be assigned to the decompressor if the decompressor can enter the assigned state without creating any conflict between the specified test pattern bits of the scan shift cycle and the actual decompressor-produced test pattern bits loaded into the scan chains while the decompressor is in that particular state. In certain embodiments, the self-loop states are assigned by invoking a solver that is used to solve equations (e.g., linear equations) representing the specified test pattern bits in one or more shift cycles of the test cube and the corresponding SL assignments. In particular embodiments, for instance, the values in these equations correspond to both specified bits of the test cubes as well as the bits implied by the assigned SL state. An exemplary procedure for assigning self-loop states is described in greater detail below.

At process block 214, compressed test pattern bits that cause the decompressor to enter the assigned states are determined. This process of determining the compressed test pattern bits is also referred to as encoding the test cube. In one particular implementation, encoding is performed by first selecting a range of test cube shift cycles to consider for encoding. In certain embodiments, for example, the test cube is partitioned (or divided) into a number of clusters, wherein each cluster corresponds to a single SL state. In particular implementations, the test cube is partitioned such that each cluster is as large as possible. That is, the test cube can be initially partitioned such that, for each cluster, a single SL state covers the largest possible number of subsequent cycles. An exemplary procedure for determining desirably large clusters for a given self-loop state is described in greater detail below.

In particular implementations, the encoding process can be performed by solving equations associated with the test cube positions at both ends of a corresponding cluster and implied by a corresponding SL state assigned to the cluster. In certain embodiments, Gauss-Jordan elimination techniques can be used to solve the equations. An exemplary process of determining and solving such equations is explained in U.S. Pat. No. 6,327,687. Furthermore, although the initial selection of the cluster boundaries may assume the largest possible span for the boundary, it may not be possible to switch a decompressor from one SL state to another SL state within a single clock cycle. In such cases, there would typically be no solution for equations representing the cluster. Accordingly, in certain embodiments, for so long as the solver cannot encode a given cluster corresponding to an assigned SL state, the cluster size is repeatedly decreased until a solution can be obtained. In such embodiments, each decrease in cluster size results in the selection of a new set of equations for the solver to solve.

In particular implementations, the cluster that will be loaded first into the scan chains is considered first during the encoding process. The next-to-be-loaded cluster can then be considered. In certain embodiments, when a cluster cannot be encoded, the cluster size is reduced by first removing the earliest shift cycles from the corresponding cluster. In other embodiments, however, cluster size is decreased by removing the latest shift cycles from the previously encoded cluster and recoding that cluster.

At process block 216, the compressed test pattern (also referred to as the compressed test cube or the seed variables) resulting from process block 214 are stored in one or more computer-readable media. The resultant seed variables produced by process block 214 can be regarded not only as a compressed test pattern but also as decompressor control data that enforces a particular state trajectory with a minimal number of state variable transitions.

Self-Loop States

Figure 3:
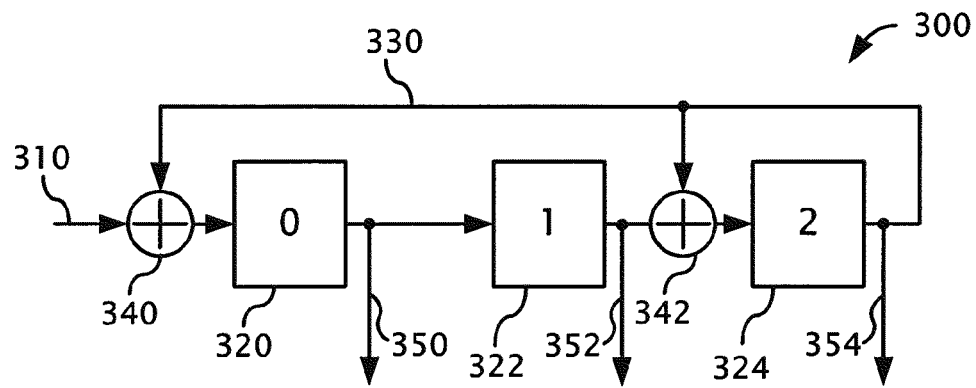
FIG. 3 is a schematic block diagram of an exemplary 3-bit linear feedback shift register ("LFSR") with a single input as may be used in embodiments of the disclosed technology.

In this section, further details concerning the self-loop (SL) states as can be used in the method of FIG. 2 are provided. FIG. 3, for example, is a schematic block diagram of a 3-bit linear feedback shift register (LFSR) 300 with a single input 310. The LFSR 300 comprises memory elements 320, 322, 324 (e.g., flip-flops, latches, or other such memory elements) coupled serially to one another and includes a feedback loop 330 coupled to the input paths of the "0"th memory element 320 and the second memory element 324 via respective logic gates 340, 342. In FIG. 3, the logic gates 340, 342 are exclusive-or (XOR) gates, though it should be understood that the logic gates can alternatively comprise other equivalent logic gates (e.g., XNOR gates). The outputs 350, 352, 354 of each of the memory elements 320, 322, 324 correspond to the output state of the LFSR 300 and are denoted as $s_0$ (for memory element 320), $s_1$ (for memory element 322), and $s_2$ (for memory element 324). The representations used in FIG. 3 for the memory elements, feedback loops, and logic gates of the LFSR 300 will be used throughout this disclosure to show the components of the various described decompressors. For ease of presentation, however, the outputs $s_n$ of an LFSR or ring generator may not be shown. It should be understood that such representations encompass other equivalent digital and logical structures.

Figure 4:
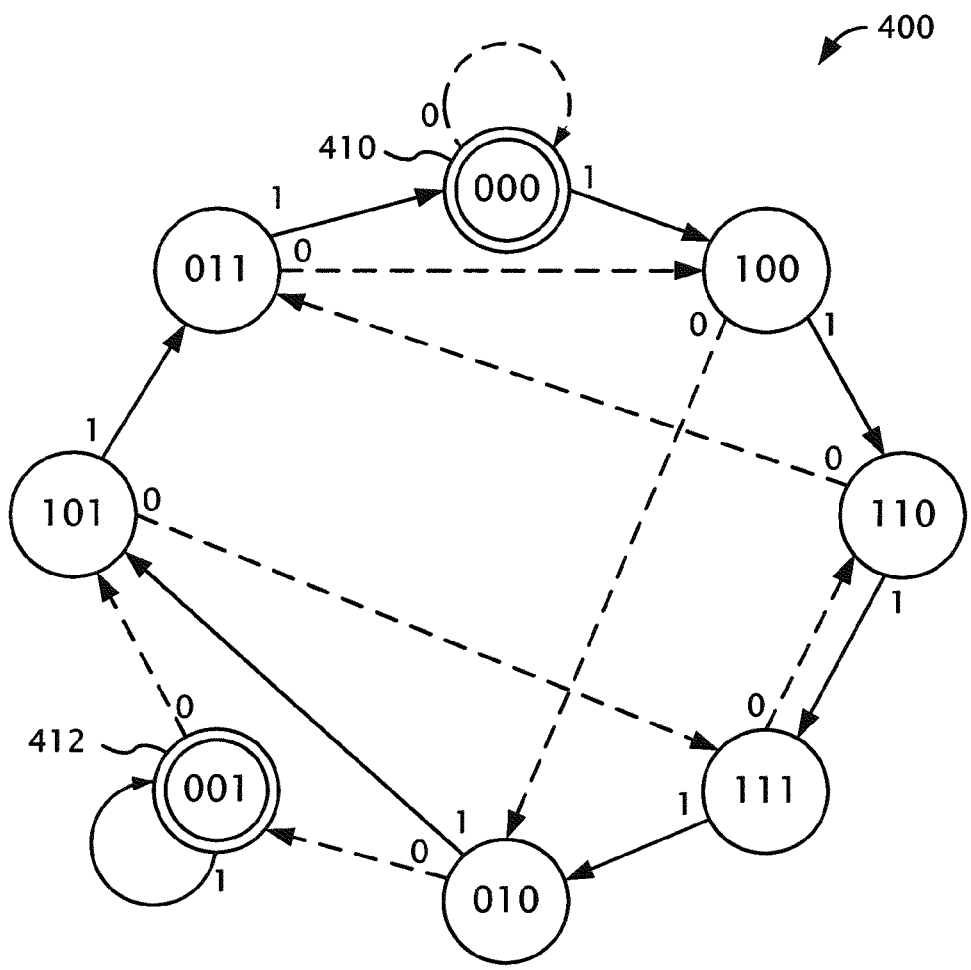
FIG. 4 is an 8-state transition graph for the LFSR of FIG. 3.

FIG. 4 is an 8-state transition graph 400 for the LFSR 300 and illustrates two SL states, 410, 412. In particular, the graph 400 indicates that the LFSR 300 will stay in state "000" (SL state 410) as long as an input bit "0" is applied, or in state "001" (SL state 412) as long as an input bit "1" is applied.

Figure 5:
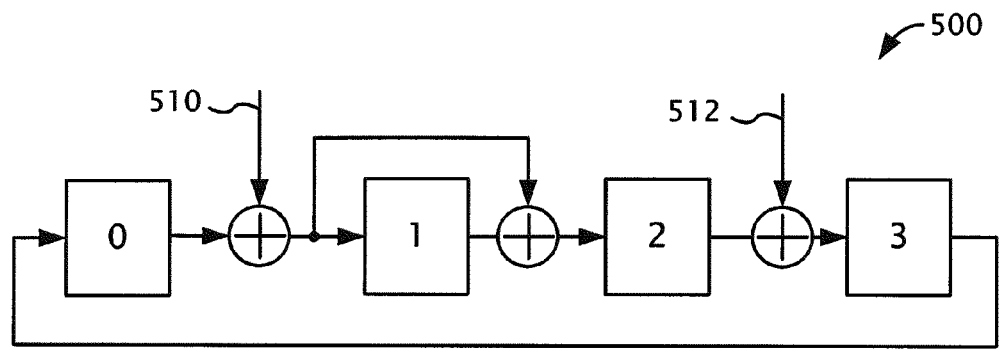
FIG. 5 is a schematic block diagram of an exemplary 4-bit ring generator as may be used as the ring generator in FIG. 1.

FIG. 5 is a schematic block diagram of a 4-bit ring generator 500, such as may be used as the ring generator 120 in FIG. 1. For the illustrated ring generator 500, if the input patterns "00," "01," "10," and "11" are applied through inputs 510, 512 after the ring generator 500 enters states "0000," "1101," "0100," and "1001," respectively, then the ring generator 500 will remain in these SL states.

In general, the number of SL states for a given ring generator (or LFSR) depends on the number of inputs. In particular, the number of SL states in a ring generator implementing a primitive polynomial and having c inputs (every pair of them separated by at least one flip-flop) is equal to $2^c$. This observation can be proven by assuming that the current state of an n-bit ring generator is s. The ring generator's next state s' is given by:

$$s' = s \cdot M + v, \tag{2}$$

where M is an n×n characteristic matrix of the ring generator, v is an n-bit input vector, and all operations are done in the Galois field modulo 2. If s is an SL state, then s'=s, and Expression (2) becomes:

$$s(M+I) = v, \quad (3)$$

where I is an identity matrix. Expression (3) has a unique nontrivial solution: $\det(M+I)=1$. Indeed, a characteristic polynomial of a ring generator can be obtained as the determinant of the matrix $M+Ix$. Hence, for $x=1$, $\det(M+Ix)=x^n+b_n x^{n-1}+\ldots+b_2 x+b_1=\det(M+I)=1+b_n+\ldots+b_2+b_1$. Because the polynomial is a primitive one, it features an odd number of terms. Thus, the number of nonzero terms in the last expression is odd, or equivalently $\det(M+I)=1$. As vector v may assume $2^c$ different values, the number of different solutions of Expression (3) with respect to s is equal to $2^c$, as well.

Expression (3) allows one to determine all possible SL states. Furthermore, and according to one exemplary embodiment, one can compute all possible SL states by computing the SL states for the following basic input vectors, each comprising only a single "1" bit: 100 ... 0, 010 ... 0, ..., 0 ... 001. The resulting SL states are referred to herein as "primitive SL states." The remaining SL states can be obtained from the primitive SL states using the principle of superposition. In particular, and according to one exemplary embodiment, a bit-wise addition of primitive SL states can be performed to find other SL states that correspond to input vectors comprising more than a single "1." A similar analysis used the principles introduced above can be performed for LFSRs or cellular automata.

Figure 6:
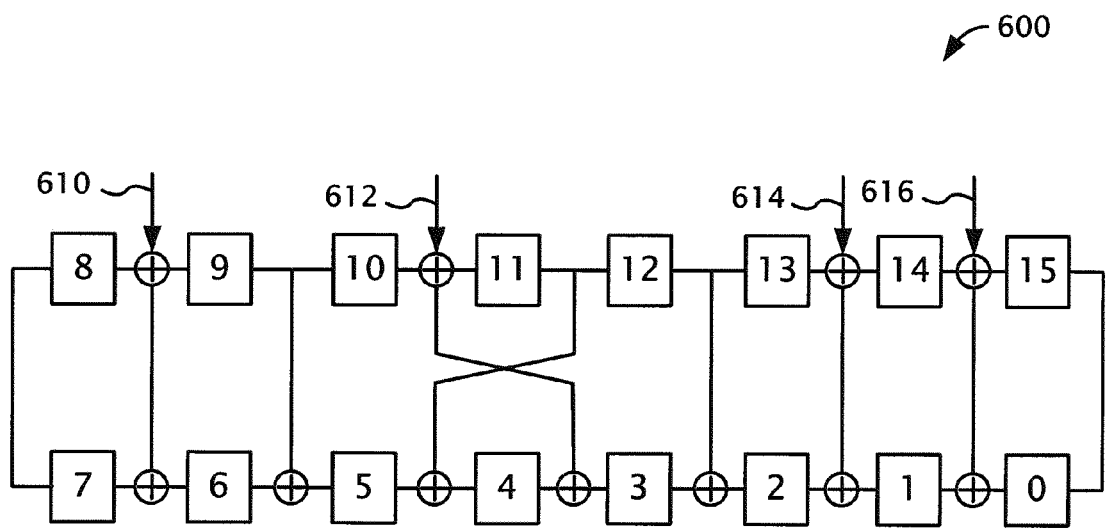
FIG. 6 is a schematic block diagram of an exemplary 16-bit ring generator as may be used as the ring generator in FIG. 1.

As an example, consider 16-bit ring generator 600 shown in FIG. 6 having inputs 610 ($h_0$), 612 ($h_1$), 614 ($h_2$), and 616 ($h_3$). In order to determine all the SL states for the ring generator 600, a vector v can be formed as follows:

$$v = [0 h_3 h_2 0 h_1 0 0 h_0 0 h_0 0 h_1 0 0 h_2 h_3] \quad (4)$$

As can be seen, the locations of variables $h_0 \div h_3$ (representing successive inputs) correspond to memory elements in the ring generator 600 driven by these terminals. Replacing variables $h_i$ in Expression (4) with four successive single-one binary combinations and then solving Expression (3) yields the following primitive SL states:

A complete list of the SL states for the ring generator 600 of FIG. 6 is presented in Table 1. In Table 1, the first row of each entry represents the input vector $h_0$ $h_1$ $h_2$ $h_3$, while the two other rows correspond to successive stages of the generator 600 shown in FIG. 6.

TABLE 1

SL states for the ring generator of FIG. 6

| | |
|---|---|
| 0 0  0 0 | 0 0  0 1 |
| 0 0 0 0 0 0 0 0 | 0 0 0 0 0 0 0 1 |
| 0 0 0 0 0 0 0 0 | 0 0 0 0 0 0 0 1 |
| 0 0  1 0 | 0 0  1 1 |
| 0 0 0 0 0 0 1 1 | 0 0 0 0 0 0 1 0 |
| 0 0 0 0 0 0 1 1 | 0 0 0 0 0 0 1 0 |
| 0 1  0 0 | 0 1  0 1 |
| 0 0 0 1 1 1 1 1 | 0 0 0 1 1 1 1 0 |
| 0 0 0 1 0 1 1 1 | 0 0 0 1 0 1 1 0 |
| 0 1  1 0 | 0 1  1 1 |
| 0 0 0 1 1 1 0 0 | 0 0 0 1 1 1 0 1 |
| 0 0 0 1 0 1 0 0 | 0 0 0 1 0 1 0 1 |
| 1 0  0 0 | 1 0  0 1 |
| 1 0 0 0 0 0 0 0 | 1 0 0 0 0 0 0 1 |
| 1 0 0 0 0 0 0 0 | 1 0 0 0 0 0 0 1 |
| 1 0  1 0 | 1 0  1 1 |
| 1 0 0 0 0 0 1 1 | 1 0 0 0 0 0 1 0 |
| 1 0 0 0 0 0 1 1 | 1 0 0 0 0 0 1 0 |
| 1 1  0 0 | 1 1  0 1 |
| 1 0 0 1 1 1 1 1 | 1 0 0 1 1 1 1 0 |
| 1 0 0 1 0 1 1 1 | 1 0 0 1 0 1 1 0 |
| 1 1  1 0 | 1 1  1 1 |
| 1 0 0 1 1 1 0 0 | 1 0 0 1 1 1 0 1 |
| 1 0 0 1 0 1 0 0 | 1 0 0 1 0 1 0 1 |

Phase Shifter Synthesis Considerations

To implement decompressors that are capable of producing both "0"s and "1"s at the outputs of their phase shifters, the impact of the SL states should be considered during phase shifter synthesis. As indicated earlier, for example, embodiments of the disclosed technology involve outputting values from ring generators operating in their SL states. The actual values loaded into the scan chains, however, result from the phase shifter coupled to the ring generator. Thus, in certain embodiments, the phase shifter architecture is evaluated during synthesis and modified if necessary such that the scan chains (e.g., each scan chain) can receive both "0"s and "1"s.

| $h_0$ | $h_1$ | $h_2$ | $h_3$ | $s_0$ | $s_1$ | $s_2$ | $s_3$ | $s_4$ | $s_5$ | $s_6$ | $s_7$ | $s_8$ | $s_9$ | $s_{10}$ | $s_{11}$ | $s_{12}$ | $s_{13}$ | $s_{14}$ | $s_{15}$ |
|---|---|---|---|---|---|---|---|---|---|---|---|---|---|---|---|---|---|---|---|
| 0 | 0 | 0 | 1 | 1 | 0 | 0 | 0 | 0 | 0 | 0 | 0 | 0 | 0 | 0 | 0 | 0 | 0 | 0 | 1 |
| 0 | 0 | 1 | 0 | 1 | 1 | 0 | 0 | 0 | 0 | 0 | 0 | 0 | 0 | 0 | 0 | 0 | 0 | 1 | 1 |
| 0 | 1 | 0 | 0 | 1 | 1 | 1 | 0 | 1 | 0 | 0 | 0 | 0 | 0 | 0 | 1 | 1 | 1 | 1 | 1 |
| 1 | 0 | 0 | 0 | 0 | 0 | 0 | 0 | 0 | 0 | 0 | 1 | 1 | 0 | 0 | 0 | 0 | 0 | 0 | 0 |

The remaining 12 SL states can be determined by summing the various combinations of the above vectors. For instance, an SL state corresponding to the input vector 1101 can be derived using the sum of the input variables [0001], [0100], and [1000]. Thus:

Otherwise, providing exclusively a constant "0" or "1" to certain scan cells may compromise the encoding capability of the compression scheme.

More specifically, given an entire set of SL states for a ring generator, it has been observed that certain architectures of

| | $h_0$ | $h_1$ | $h_2$ | $h_3$ | $s_0$ | $s_1$ | $s_2$ | $s_3$ | $s_4$ | $s_5$ | $s_6$ | $s_7$ | $s_8$ | $s_9$ | $s_{10}$ | $s_{11}$ | $s_{12}$ | $s_{13}$ | $s_{14}$ | $s_{15}$ |
|---|---|---|---|---|---|---|---|---|---|---|---|---|---|---|---|---|---|---|---|---|
| | 0 | 0 | 0 | 1 | 1 | 0 | 0 | 0 | 0 | 0 | 0 | 0 | 0 | 0 | 0 | 0 | 0 | 0 | 0 | 1 |
| | 0 | 1 | 0 | 0 | 1 | 1 | 1 | 0 | 1 | 0 | 0 | 0 | 0 | 0 | 0 | 1 | 1 | 1 | 1 | 1 |
| + | 1 | 0 | 0 | 0 | 0 | 0 | 0 | 0 | 0 | 0 | 0 | 1 | 1 | 0 | 0 | 0 | 0 | 0 | 0 | 0 |
| | 1 | 1 | 0 | 1 | 0 | 1 | 1 | 0 | 1 | 0 | 0 | 1 | 1 | 0 | 0 | 1 | 1 | 1 | 1 | 0 | phase shifters may produce only one logical value at an output. Consequently, in certain embodiments of the disclosed technology, the synthesis of the phase shifter includes an additional verification step that precedes the inter-channel separation tests. For instance, for scan chains to be driven by a candidate combination of the generator outputs (XOR taps) (e.g., for every scan chain to be driven by a linear combination of the generator outputs), an evaluation can be made to determine whether it is possible with the candidate taps to yield both a "0" and "1" when applying successive SL states. If the generation of a "0" and "1" is not possible, then the candidate taps are rejected, and a new combination of taps are generated randomly.

As an example, consider again the ring generator 600 of FIG. 6 with phase shift circuitry $s_2 \oplus s_3 \oplus s_4$. If only the four primitive SL states were employed, this particular phase shifter would always produce a constant "0." In fact, all the remaining SL states would also yield "0".

Exemplary Implementations for the SL State Assignment and Test Cube Encoding Procedures In this section, exemplary techniques for assigning SL states and encoding test cubes are described. The exemplary techniques can be used, for example, at process blocks 212 and 214 of FIG. 2.

As explained above with respect to process block 212 of FIG. 2, the SL state assignment process involves evaluating one or more scan shift cycles of a test cube containing at least one specified bit and assigning SL states that create no conflict between the binary values produced by such states (e.g., via the phase shifter) and the actual specified test pattern bits of the test cube. In particular embodiments, subsequent to assigning the SL states to the scan shift cycles having specified bits, the SL state assignments are extended to the remaining shift cycles of the test cube in such a way that the number of transitions is kept as small as possible.

Figure 7:
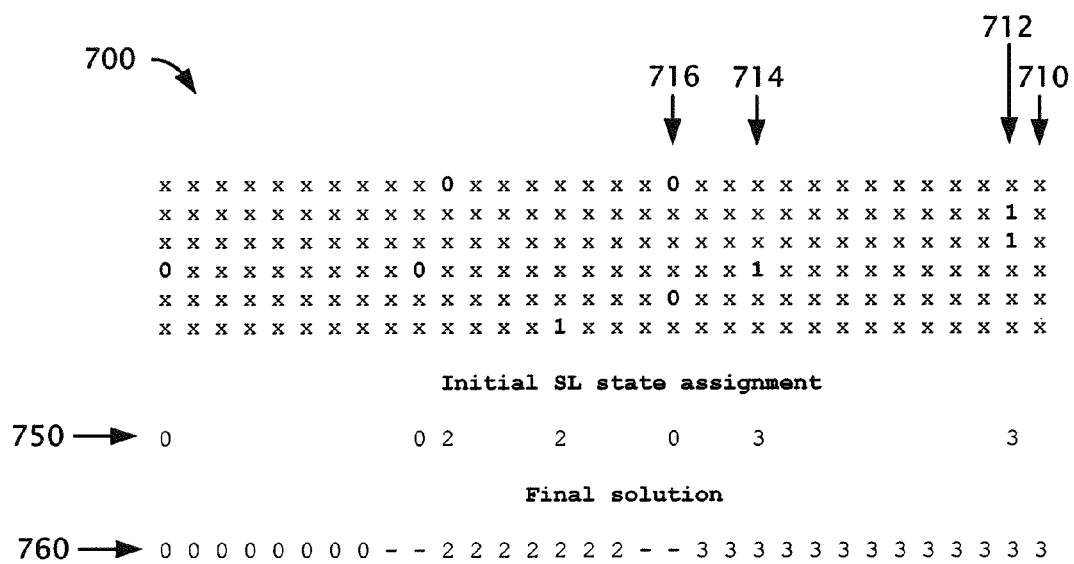
FIG. 7 is a diagram of a first exemplary test cube having specified bits and unspecified bits.

To illustrate one exemplary implementation of the assignment procedure, consider the test cube 700 shown in FIG. 7. The test cube 700 comprises 32 slices (shown as the 32 columns in the test cube 700) corresponding to successive scan chain shift cycles. The test cube 700 is to be loaded into six scan chains (shown as the six rows in the test cube 700). In FIG. 7, it is assumed that the scan chains are loaded from the left. Thus, the column 710, which is farthest to the right in FIG. 7, represents the first slice loaded into the scan chains. The "x" values denoted in the text cube 700 indicate "don't care" positions. For purposes of this example, assume that the scan chains are driven by the ring generator 500 of FIG. 5 coupled to a phase shifter whose six outputs ($z_0$ through $z_5$) are given by the following expressions:

$z_0 = s_0 \oplus s_2$, $z_1 = s_1 \oplus s_3$, $z_2 = s_2 \oplus s_3$, $z_3 = s_0 \oplus s_1$, $z_4 = s_1 \oplus s_2$, $z_5 = s_1 \oplus s_2 \oplus s_3$ Using the analysis techniques demonstrated earlier, the ring generator 510 of the decompressor features four SL states having the following output values: 0000 (SL state 0), 1101 (SL state 1), 0100 (SL state 2), 1001 (SL state 3). The four SL states result in the following respective combinations at the outputs of the phase shifter: 000000, 101010, 010111, and 111101. States 1101 and 0100 are primitive states. Indeed, it can be easily verified that if input patterns 01 or 10 are applied, respectively, then once the decompressor enters one of these respective states, the decompressor will remain there.

In certain embodiments, for one or more shift cycles of the test cube having one or more specified bits, attempts are made to assign an SL state having no conflicts with the specified positions. A desired SL state $S = \{s_1, s_2, \ldots, s_n\}$ can be obtained by solving the following system of n linear equations in c unknowns $a_i$ over GF(2):

$$S = \sum_{i=1}^{c} a_i P_i, \tag{5}$$

where $P_i$ is ith primitive SL state, and variable $a_i \in \{0, 1\}$ indicates whether $P_i$ should be used to form S. Typically, the primitive SL states in Expression (5) are replaced with the corresponding combinations that these states yield through a phase shifter. The resulting SL states can be easily restored as shown earlier. Consider, for example, the ring generator 500 of FIG. 5. For this ring generator, Expression (5) assumes the form:

$[s_1, s_2, s_3, s_4, s_5, s_6] = a_1 \cdot [101010] + a_2 \cdot [010111]$.

The second slice of the test cube 700 (shown as slice 712 in FIG. 7) can be assigned SL state 3, only. Thus, Expression (5) has the form:

$[s_1, 1, 1, s_4, s_5, s_6] = a_1 \cdot [101010] + a_2 \cdot [010111]$.

This can be reduced to:

$a_1 \cdot 0 + a_2 \cdot 1 = 1$ $a_1 \cdot 1 + a_2 \cdot 0 = 1$ which yields a solution $a_1 = 1$ and $a_2 = 1$. Hence, $[s_1, s_2, s_3, s_4, s_5, s_6] = [101010] + [010111] = [111101]$. The combination [111101] corresponds to SL state 1001 (or SL state 3).

According to one embodiment, the assignment procedure then considers the next shift cycle having one or more specified test pattern bits and evaluates whether this next specified slice conflicts with the solution obtained for the previous slice. Note that in certain cases, the first specified slice considered will have multiple solutions. In these cases, each solution can be evaluated against the next specified slice considered, potentially decreasing the number of solutions as the procedure advances to each additional specified slice.

Returning to the example illustrated in FIG. 7, the next specified slice occurs in the test cube 700 is in the 11th shift cycle (shown as slice 714 in FIG. 7). Because the slice 714 has a "1" in its fourth position, it is already covered by SL state 1001. In general, however, mapping specified slices into SL states requires incremental solving of new equations that correspond to subsequent specified slices. In particular implementations, this incremental process is carried on until the first mapping failure (e.g., until Expression (5) has no solution). When this occurs, and according to one exemplary embodiment, the last valid solution of Expression (5) is restored, and the assignment procedure begins again from the next slice of the test cube having no assigned SL state. For example, a conflict between specified bits in a given scan chain cycle and the currently assigned SL state will cause the current assignment procedure to stop. This applies, for instance, to slice 716 (0xxx0x). The slice 716 cannot be mapped into vector [111101], which corresponds to SL state 1001 (SL state 3). By starting the assignment process again at the slice 716, Expression (5) will indicate that the slice 716

(0xxx0x) can be assigned to SL state 0000 (SL state 0) which produces a non-conflicting vector of [000000]. Accordingly, in one exemplary embodiment, the SL state 1001 (or SL state 3) will initially be assigned to the slice 714. In certain embodiments, this process continues until the end of the scan chains is reached. In certain embodiments, when there is a complete mapping failure, no SL state assignment is made at all.

The illustrative approach described above yields the initial SL state assignments as shown at 750 in FIG. 7. Note that even for systems with a large number of SL states, the selection and assignment of the SL states can still be performed in a time efficient manner using embodiments of the disclosed technology, as there is no backtracking and no need to maintain an exponential-in-size list of pre-computed SL states.

At process block 214 of FIG. 2, compressed test pattern values that cause the decompressor to produce the assigned SL states are determined. In certain exemplary implementations, this procedure has two main objectives: to encode the specified test pattern bits of the test cube so that the targeted faults can be detected; and to reach and hold the assigned SL states as much as possible.

According to one exemplary embodiment for determining the compressed test pattern bits, two groups of equations are considered during the encoding procedure. In this embodiment, the first group of equations is directly related to the values specified in the test cube and targeting one or more faults (as in the standard EDT encoding procedure). The second group of equations corresponds to the specified test pattern bits occurring in vectors produced by the assigned SL states.

In one particular embodiment, the equations to be solved are chosen as follows. Given one or more specified slices S grouped with a commonly assigned SL state, the solver attempts to solve equations that represent the assigned SL state as replacing the unspecified shift cycles located as far as possible to the right and to the left of the slices S in the test cube and having no previously assigned SL state. If the solver fails to encode these slices (which conceptually flank a cluster of slices assigned to the SL state), then the size of the cluster is decreased, and the solver attempts to solve another set of equations corresponding to new (relocated) boundaries of a reduced cluster. As noted above, the method of reducing the size of the cluster can vary, and in one exemplary embodiment involves moving the rightmost slice (corresponding to the first slice of the cluster to be shifted into the scan chain) one shift cycle to the left (corresponding to the shift cycle that is one shift cycle later).

An example of this technique is illustrated in row 760 of FIG. 7 (denoted as the final solution), where the clusters of slices that can actually be formed by SL states are shown. FIG. 7 indicates that during the encoding process, the solver determined that it was not possible to include the third specified slice (slice 716) into the second cluster. (In FIG. 7, an unsuccessful encoding of the specified bits with the desired SL state is denoted with a "-".) In fact, as seen by FIG. 7, the right flank of the third cluster had to be moved by two shift cycles to make the corresponding set of equations solvable. In other words, a transition period of two clock cycles was needed for the decompressor to switch from SL state 0100 (SL state 2) to SL state 0000 (SL state 0).

It should be noted that a completely specified slice can be uniquely mapped into a corresponding SL state of the ring generator. Thus, the number of equations required to handle any given slice is typically no greater than the size of a ring generator. This number is usually much smaller than the number of scan chains—which correspond to the number of equations one might expect to process.

Exemplary embodiments of the technique described above can be used to find large clusters (e.g., the largest possible clusters) of test cube slices that may be assigned to the same SL state. Because the internal slices in a given cluster have the same fill, the transitions created during scan chain loading are consequently reduced. Furthermore, in certain embodiments, the process for determining the corresponding compressed test pattern for any given cluster is simplified, as such input vectors are uniquely related to the assigned SL state.

FIG. 8 illustrates an original random fill 800 produced using a conventional EDT compression scheme for the test cube 700 shown in FIG. 7. Each star "*" located in the last row of FIG. 8 indicates a shift cycle whose content differs from the content of its direct predecessor (the next column to the right). The corresponding switching rate, as defined by Expression (1), for the original random fill 800 is 50.52%. A low power fill 900 obtained using an embodiment of the method described above is shown in FIG. 9. The weighted transition metric for the low power fill 900 is 7.76%.

The difference in the number of transitions, and thus the total power consumption, can also be observed in representations 1000 and 1100 shown in FIGS. 10 and 11, respectively. In representations 1000 and 1100, two consecutive and different bits are represented by a shaded box having the same location as that of the corresponding transition in FIGS. 8 and 9. Further, the width of each box is proportional to power expended shifting that pair of bits into a scan chain. FIG. 11 represents the total power dissipated when using the exemplary encoding scheme described above and shows a clear reduction in the total power consumed.

In certain embodiments, the solver used to determine the final compressed test pattern values can be sped up by taking advantage of a property of sets of linear equations formed with the participation of SL states. Specifically, a given SL state corresponds to a set of n linearly independent equations (associated with stages of an o-bit ring generator) in v variables injected so far into the decompressor. These equations can be designated as so-called "main equations." Now suppose that no new variables are injected into the ring generator but that the ring generator continues to run. The resultant equations in v variables represent locations in time frames that follow a given SL state and that are also linear combinations of the main equations. Thus, in one exemplary embodiment, the variables injected through the occurrence of a given SL state do not need to be considered beyond the SL state to encode the next specified bits. Therefore, only new variables, injected in subsequent time frames, have a bearing on performing Gauss-Jordan elimination for new equations. The same rule applies to the next SL states. This observation allows the solver to operate using only a small subset of the variables provided to the decompressor between two consecutive SL states. By limiting the number of variables considered by the solver in this manner, solver performance can be sharply accelerated (e.g., up to 10×).

Experimental Results

An embodiment of the low power decompression scheme described above was tested on several industrial designs. In the table below, results for some of the tests (in which designs ranging in size from 220K to 2.7M gates were tested) are presented. For each design, EDT with different compression levels was used by fixing the number of scan channels to 8 and utilizing a 32-bit decompressor.

The primary goal of the experiments was to compare the switching activity resulting from the application of test patterns produced in a conventional EDT environment and from test patterns produced using an exemplary embodiment of the described low power encoding scheme. Results of the experiments are summarized in Table 2. In addition to the number of gates and the scan chain architecture, the following information is given for each circuit: the fill rate (that is, the percentage of specified bits); the switching rate measured by means of the weighted transition metric and assuming that a standard embedded deterministic test is employed (column SDT); the switching rate using test patterns produced using an embodiment of the described low power encoding scheme (column LP); the effective EDT compression ratio (defined here as a ratio of the number of scan cells and the actual number of test data bits necessary to compress all test cubes); and the compression ratio achievable when applying the exemplary low power encoding scheme.

As can be seen from Table 2, in all examined cases a substantial (up to 23 times) reduction in the total number of transitions was achieved. Thus, a significant reduction in the switching rate was observed. It is worth noting that one can trade off compression for power consumption because increased compression ratios typically create increased switching rates.

Assuming that an ATE offers a "repeat the last pattern" function, one can achieve even higher levels of test data compression. The column labeled "compression" in Table 2 illustrates this phenomenon. When applying the exemplary embodiment of the low power encoding scheme, test data volume reduction ordinarily depends on the number v of resulting c-bit patterns. Additional post-processing can be performed to identify adjacent seed values that are identical. If found, the seed values can be replaced by a copy of themselves. Consider, for example, the low power fill 900 shown in FIG. 9. The corresponding input vector for the low power fill 900 of FIG. 9 is the following (where adjacent identical seeds are replaced with dots except for the seed in the first cycle):

. . . 0 . 1 0 . . . 0 . 0 1 . . . 1 . 0
    . . . 0 . 1 0 . . . 1 . 0 0 . . . 1 . 1

Each seed pattern can use a counter indicating how many times a particular vector should be applied. In the reported experiments, this quantity is represented by the number of bits needed to encode the counter value. Hence, in certain embodiments, the total volume of compressed test data is equal to v c-bit patterns and associated v binary counters. Note that this technique was used to estimate compression for both the conventional EDT scheme and its low power counterpart and is reported in the final two columns of Table 2.

As far as tester interfaces are concerned, embodiments of the disclosed encoding scheme have an ability to handle scan-in and scan-out data rates that are higher than the rate at which the test provides data. For example, stimulus can be updated on the input and probed on the output once per several shift clock cycles. In fact, it is possible to download test responses in pre-selected scan shift cycles, as demonstrated in J. Rajski, J. Tyszer, M. Kassab, and N. Mukherjee, "Embedded deterministic test," *IEEE Trans. CAD*, vol. 23, pp. 776-792 (May 2004) and in J. Rajski, et al., "X-Press Compactor for 1000× Reduction of Test Data," *Proc. ITC*, paper 18.1 (2006), for the so-called X-press compactor (see also U.S. Pat. Nos. 6,327, 687; 6,353,842; 6,557,129; 6,684,358; 6,874,109; and U.S. Patent Application Publication No. 2003/0120988). As a result, the decompressor and compactor may communicate with the tester using the same sampling intervals, and operate autonomously during the remaining scan cycles.

The application of test patterns produced using embodiments of the disclosed low power encoding scheme typically reduces the degree of randomness observed in the scan chains. Consequently, the resulting fault coverage may be impacted. For example, for the circuits reported in Table 2, the stuck-at fault coverage decreased only slightly after applying the low power test patterns. In order to counteract this phenomenon, additional test patterns were deployed to preserve the original test coverage. For instance, the increase in pattern count in the case of design D1 was roughly equal to 12% and 6.5%, for 100 and 200 scan chains, respectively. In the case of 400 scan chains, the low power fill actually reduced the pattern count by 5.5%.

Furthermore, the bridging coverage estimate (BCE) (see, e.g., B. Benware, et al., "Impact of Multiple-Detect Test Patterns on Product Quality," *Proc. ITC*, pp. 1031-1040 (2003)) can be used to assess the same phenomenon for bridging defects when applying original EDT test patterns and low power stimuli. This metric allows one to estimate the impact of low power stimuli on detection of unmodeled defects. This metric is derived from data indicating how many times each stuck-at fault is detected and is defined as follows:

$$BCE = F^{-1} \sum_{i=1}^{n} (1 - 2^{-i}) f_i, \qquad (6)$$

where F is the total number of stuck-at faults, $f_i$ is the number of stuck-at faults that are detected i times by a given test set, and n is the maximum number of times a fault is detected. Again, for design D1, the difference between BCE obtained by using the original EDT test patterns and the low power stimuli having the same stuck-at fault coverage was 0.58%, 0.43%, and 0.08%, depending on the scan chains configuration.

TABLE 2

Experimental Results

| Design | Gates | Tests | Scan Chain | Fill Rate (%) | Switching (%) SDT | LP | Compression (x) SDT | LP |
|---|---|---|---|---|---|---|---|---|
| D1 | 220K | 5378 | 100 × 126 | 0.26 | 37.26 | 6.59 | 60.19 | 63.88 |
|  |  | 5378 | 200 × 63 | 0.26 | 36.18 | 11.71 | 71.85 | 70.77 |
|  |  | 5378 | 400 × 32 | 0.26 | 34.34 | 17.80 | 90.92 | 85.60 |
| D2 | 427K | 1506 | 50 × 570 | 0.98 | 35.86 | 13.20 | 26.42 | 19.40 |
|  |  | 1484 | 100 × 285 | 0.92 | 35.47 | 17.36 | 35.22 | 27.92 |
|  |  | 1348 | 200 × 143 | 0.65 | 35.68 | 23.48 | 56.01 | 46.13 |
|  |  | 5912 | 50 × 570 | 0.48 | 37.73 | 7.69 | 44.10 | 31.02 |
|  |  | 5898 | 100 × 285 | 0.48 | 36.19 | 11.04 | 52.71 | 39.62 |
|  |  | 5864 | 200 × 143 | 0.46 | 39.11 | 20.16 | 66.78 | 52.74 |

TABLE 2-continued

Experimental Results

| Design | Gates | Tests | Scan Chain | Fill Rate (%) | Switching (%) SDT | Switching (%) LP | Compression (x) SDT | Compression (x) LP |
|---|---|---|---|---|---|---|---|---|
| D3 | 1.1M | 10274 | 100 × 752 | 0.24 | 43.64 | 7.92 | 76.95 | 62.54 |
|  |  | 10281 | 200 × 376 | 0.24 | 43.52 | 12.42 | 89.55 | 75.48 |
|  |  | 10270 | 400 × 188 | 0.23 | 44.11 | 19.81 | 113.78 | 99.61 |
| D4 | 1.1M | 26635 | 100 × 702 | 0.11 | 28.58 | 4.05 | 237.11 | 314.53 |
|  |  | 26635 | 200 × 351 | 0.11 | 35.94 | 2.85 | 238.41 | 315.38 |
|  |  | 26635 | 400 × 176 | 0.11 | 34.11 | 6.01 | 270.86 | 334.82 |
|  |  | 26635 | 800 × 88 | 0.11 | 32.70 | 10.01 | 327.18 | 389.40 |
| D5 | 543K | 24657 | 100 × 452 | 0.13 | 41.67 | 3.61 | 104.01 | 113.98 |
|  |  | 24657 | 200 × 226 | 0.13 | 41.96 | 6.53 | 114.99 | 129.32 |
|  |  | 24657 | 400 × 113 | 0.13 | 42.54 | 10.89 | 135.31 | 152.78 |
| D6 | 2.7M | 63593 | 100 × 1382 | 0.04 | 34.71 | 1.51 | 328.13 | 348.42 |
|  |  | 63593 | 200 × 691 | 0.04 | 39.32 | 2.41 | 343.89 | 380.81 |
|  |  | 63593 | 400 × 346 | 0.04 | 37.04 | 4.00 | 375.88 | 413.48 |
|  |  | 63593 | 800 × 173 | 0.04 | 38.72 | 7.09 | 416.06 | 473.19 |

By taking advantage of self-loop transitions in finite-state-machine models of test data decompressors, embodiments of the disclosed encoding scheme can be used to reduce power dissipation during scan chain loading. Experimental results confirm that for industrial circuits, embodiments of the disclosed scheme can result in up to a 23× reduction of test power during scan shifting. This reduction in power consumption can allow for accelerated scan shifting, thereby reducing the overall test application time.

Certain embodiments of the disclosed technology exhibit a number of qualitative differences over conventional test pattern encoding schemes. For example, as a purely software approach, certain embodiments of the disclosed technology can be implemented without any modifications to the test hardware or test logic. For example, neither scan chain reconfiguration, additional steering logic in the front of scan chains, nor extra control test data are needed in certain embodiments. Moreover, the decompressor and the manner in which it is loaded remain unchanged in some embodiments. Furthermore, the resultant test cubes produced using embodiments of the described low power technique do not compromise the quality of test.

Embodiments of Low Power Decompressors

The following sections describe decompressor embodiments that can be used to generate low power test patterns. In particular, the disclosed embodiments concern specially designed decompressors for generating low power test patterns. As with the low power encoding techniques described above, the low power decompressor embodiments described in this section are mainly discussed in the context of an EDT environment, though it should be understood that the principles described herein are not limited to this environment.

In general, EDT-based compression exploits the fact that test cubes feature a large number of unspecified positions. As explained above, the low fill rates also make it possible to deliver identical test data to scan chains for a number of shift cycles, thereby reducing the total number of transitions without affecting the desired fault coverage. In order to implement this desired result, a mechanism for sustaining the outputs of a decompressor for more than a single clock cycle can be used. Furthermore, in certain embodiments, the mechanism still allows the decompressor to change its internal state to ensure successful encoding of upcoming specified bits.

Figure 12:
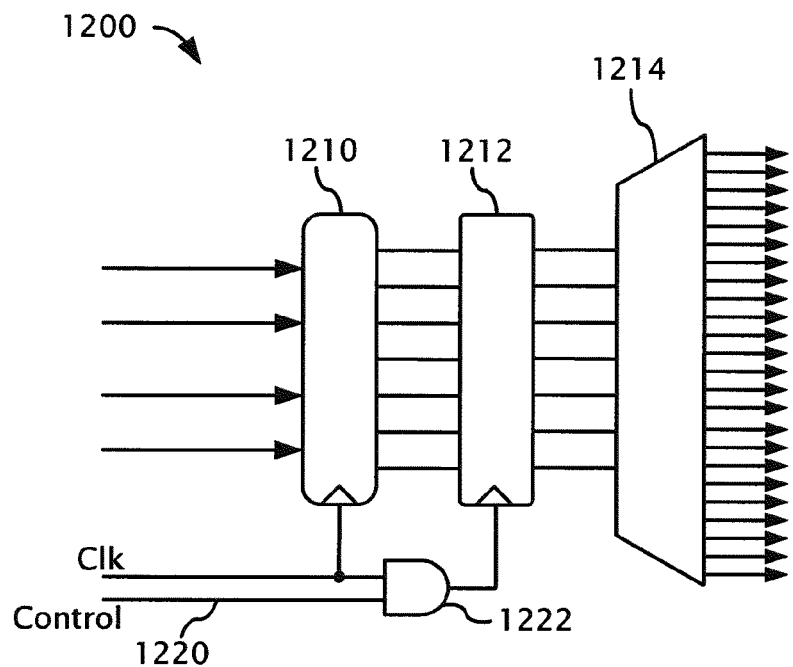
FIG. 12 is a schematic block diagram of a first exemplary architecture of a low power decompressor.
Figure 13:
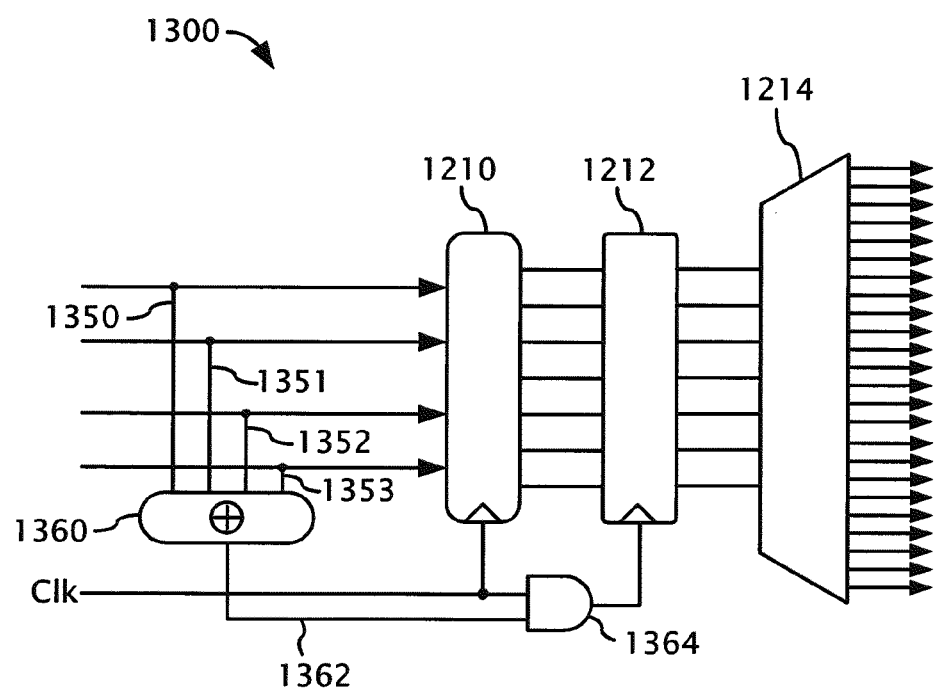
FIG. 13 is a schematic block diagram of a second exemplary architecture of a low power decompressor.

Exemplary embodiments of on-chip test data decompressors designed to produce low power test patterns are shown in FIGS. 12 and 13. In particular, FIG. 12 shows a decompressor 1200, and FIG. 13 shows a decompressor 1300. The decompressors 1200, 1300 comprise a ring generator 1210, a shadow register 1212 coupled to the outputs of the ring generator 1210, and a phase shifter 1214 coupled to the outputs of the shadow register 1212.

Using either the decompressor 1200 or the decompressor 1300, the same data can be provided to the scan chains for a number of shift cycles through the shadow register 1212 located between the ring generator 1210 and the phase shifter 1214. In particular embodiments, the shadow register 1212 captures and saves, for a number of cycles, a desired state of the ring generator 1210, while the ring generator 1210 itself advances to the next state used to produce another group of specified bits. The independent operations of the ring generator 1210 and the shadow register 1212 can produce virtually any state and, in certain embodiments, are operated to produce multiple sets of consecutive states which create no conflicts with the specified bits of the test cubes, thereby reducing the transition count.

An extra input channel C can be used to facilitate the operation of the shadow register. The decompressor 1200 in FIG. 12, for example, uses an extra input channel for controlling the shadow register 1212. In particular, a control bit can be sent to the decompressor 1200 on a control channel 1220 (e.g., at every cycle) in order to indicate whether the shadow register 1212 should be reloaded with the current content of the ring generator 1210. In the illustrated embodiment, for example, the control channel 1220 is coupled to the clock input of the shadow register 1212 via a suitable logic gate (e.g., AND gate 1222, which also inputs the shift clock). In one particular embodiment, if the control bit is set to "1," then the shadow register 1212 updates its state at some time before the ring generator 1210 reaches its next state (e.g., on the negative edge of the system clock). Note that the control channel 1220 may not be used during the initialization phase of the ring generator 1210.

Figure 23:
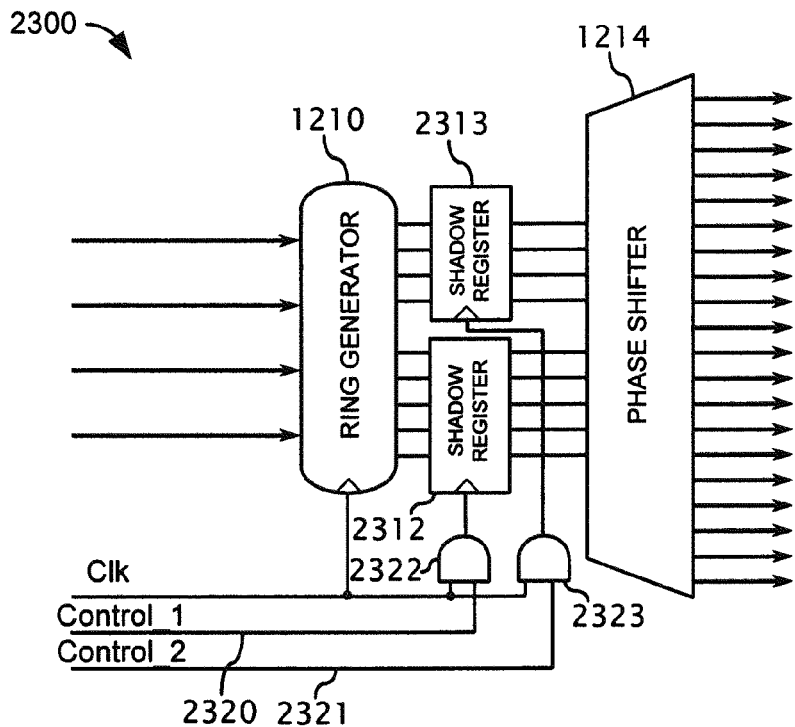
FIG. 23 is a schematic block diagram of a third exemplary architecture of a low power decompressor.

In other decompressor embodiments, a plurality of shadow registers and/or phase shifters are used. For example, FIG. 23 shows a decompressor 2300 comprising two shadow registers 2312, 2313 coupled to two extra input channels 2320, 2321. Decompressor 2300 also comprises a ring generator 1210, a shadow register 1212 coupled to the outputs of the ring generator 1210, and a phase shifter 1214 coupled to the respective outputs of the two shadow register 2312, 2313. Control bits can be sent to the decompressor 2300 on control channels 2320, 2321 (e.g., at every cycle) in order to indicate whether one or both of the shadow registers 2312, 2313 should be reloaded with the corresponding output from the ring generator 1210. In the illustrated embodiment, for example, a first control channel 2320 is coupled to the clock input of the shadow register 2312 via a suitable logic gate (e.g., AND gate 2322, which also inputs the shift clock). Further, a second control channel 2321 is coupled to the clock input of the shadow register 2313 via another suitable logic gate (e.g., AND gate 2323, which likewise inputs the shift clock). Using multiple shadow registers allows the decompressor to maintain a portion of an applied test pattern in a constant state while the other portion may include one or more transitions.

Figure 24:
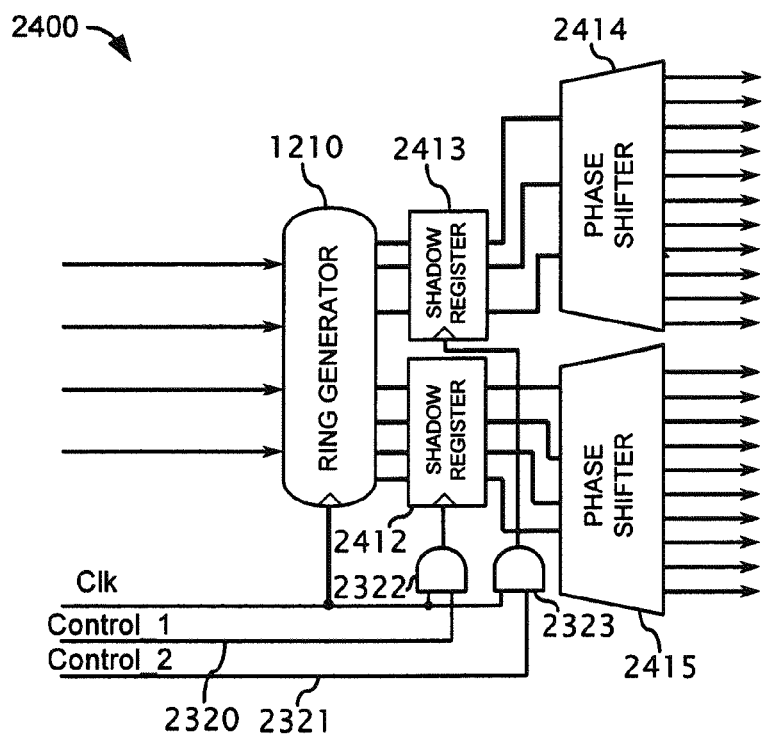
FIG. 24 is a schematic block diagram of a fourth exemplary architecture of a low power decompressor.

FIG. 24 shows another decompressor embodiment 2400 having multiple shadow registers. In FIG. 24, a plurality of phase shifters are coupled to respective shadow registers. In particular, a first phase shifter 2414 is coupled to shadow register 2413, and a second phase shifter 2415 is coupled to shadow register 2412.

In order to reduce switching activity in the scan chains, an appropriate compression procedure for producing compressed test patterns for the decompressor can be used. For example, according to one exemplary embodiment, the compression procedure involves partitioning a test cube into one or more clusters, each comprising one or more consecutive slices (time frames or shift cycles) characterized in that the slices inside a cluster have no transitions. This allows a given decompressor state to be repeated many times in succession, using the shadow register to store the state that the ring generator entered at the beginning of a cluster. The actual cluster size is typically determined by the ability to encode the specified bits occurring within the boundaries of the cluster.

Figure 14:
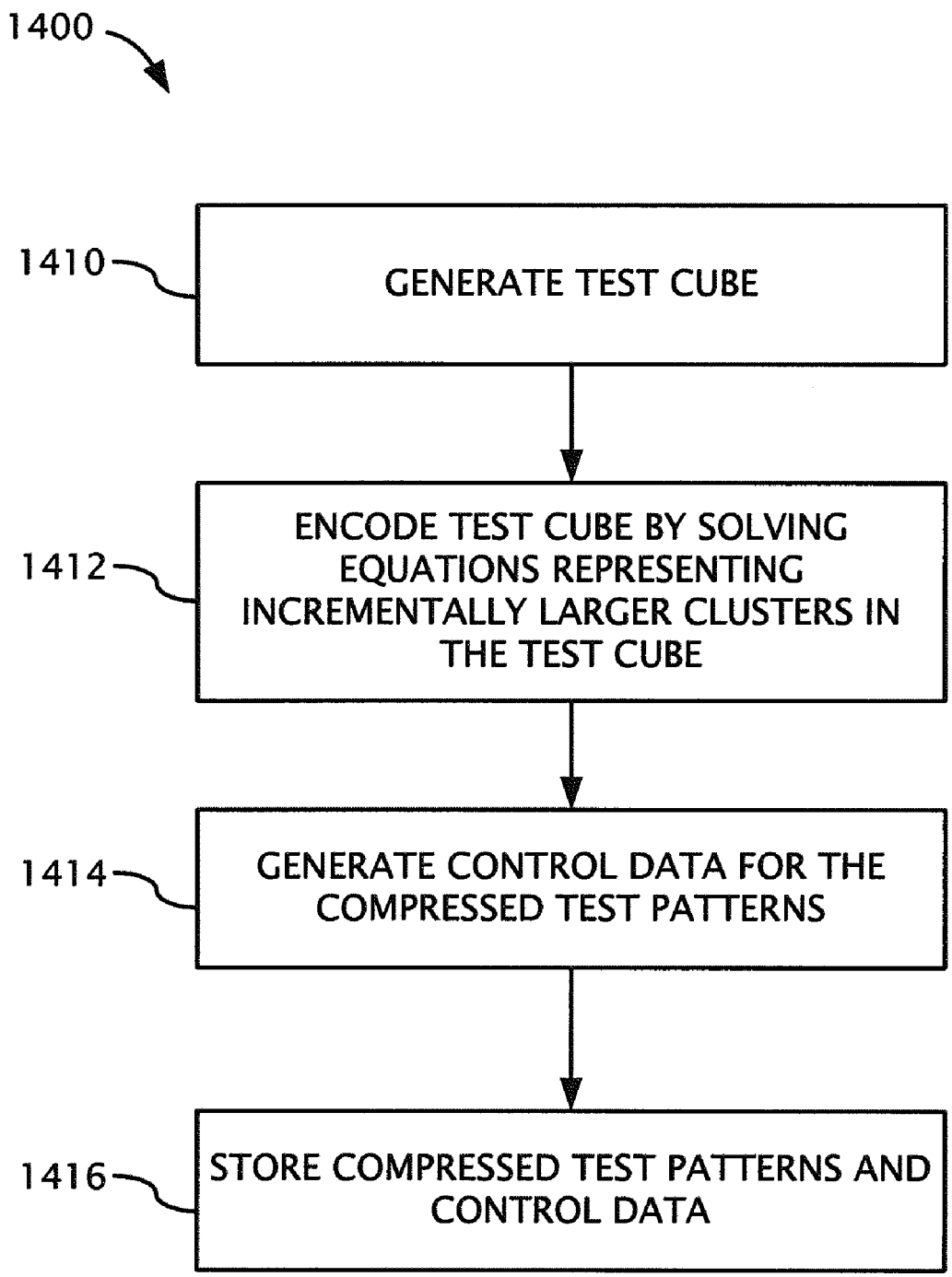
FIG. 14 is a flow chart showing an exemplary technique for generating compressed test patterns for low power decompressors, such as those illustrated in FIGS. 12, 23 and 24.

FIG. 14 is a flow chart showing an exemplary encoding process for the decompressor architecture shown in FIG. 12. At process block 1410, a test cube is generated. The test cube can be generated using a variety of well-known ATPG techniques and can target a variety of possible faults (e.g., stuck-at faults, transition faults, and the like). The generated test cube typically comprises specified test pattern bits targeting one or more faults of the circuit-under-test and unspecified bits (the "don't care" bits).

At process block 1412, the test cube is encoded by solving equations (e.g., linear equations) representing incrementally larger clusters in the test cube. Gauss-Jordan elimination techniques can be used, for example, to solve the equations. In certain embodiments, the encoding process begins with a cluster comprising the one or more clock cycles of the test cube to be applied first and up to the first shift cycle having specified bits. In these embodiments, the process incrementally adds specified bits from the later shift cycles, gradually progressing toward the other end of the test cube. As long as the solver can compress the specified bits in the cluster, the process continues by repeatedly increasing the size of the cluster, adding a new equation for each new specified bit not yet encoded, and invoking the solver again. At some point, a solution may not exist. When a solution cannot be found, and in certain embodiments, this particular time frame is assigned to a new cluster and the procedure is repeated for the new cluster. As a result of this process, the overall number of clusters used to cover the test cube can be reduced.

At process block 1414, the control data for operating the shadow register of the decompressor is determined. For example, in certain embodiments, control data is determined that causes the shadow register to load the desired ring generator state into the register just before the first cycle of each cluster determined during the encoding process 1412.

At process block 1416, the compressed test patterns (e.g., the variable seeds causing the ring generate to output the desired states) and the control data are stored in one or more computer-readable media.

As an example, consider test cube 1500 shown in FIG. 15, which ordinarily has a switching rate of 54.56%. The same test cube encoded using the process described above and for a 4-bit-output and 2-bit-input decompressor based on the design of FIG. 12 is illustrated as test pattern 1600 in FIG. 16. As can be seen in FIG. 16, only three different states of the ring generator are used to cover the whole pattern. Consequently, the switching rate is reduced to 3.12%. Furthermore, a transition between these states can be implemented with no impact on the content of the scan chains, as the shadow register separates the ring generator from the scan chains.

In other embodiments, instead of using a dedicated control channel to control the shadow register (such as the control channel 1220), the decompressor input channels can be used to deliver the control information merged with the seed variables. An example of a decompressor architecture using the input channels to deliver the control information is shown in FIG. 13 as decompressor 1300. In FIG. 13, inputs 1350, 1351, 1352, 1353 (corresponding to the branches of the input paths from an external tester) drive an XOR tree 1360, which computes a parity signal for input variables injected during a given shift cycle. The parity signal can be output on a control path 1362 used to control the clocking of shadow register 1212. For example, the control path 1362 can be coupled to the clock input of the shadow register 1212 through a suitable logic gate (e.g., AND gate 1364, which also inputs the shift clock). In certain embodiments, seed variables enter the ring generator 1210 whenever the parity of the inputs 1350, 1351, 1352, 1353 is odd. When the parity of the inputs is even, by contrast, the content of the register 1212 remains unchanged.

Figure 17:
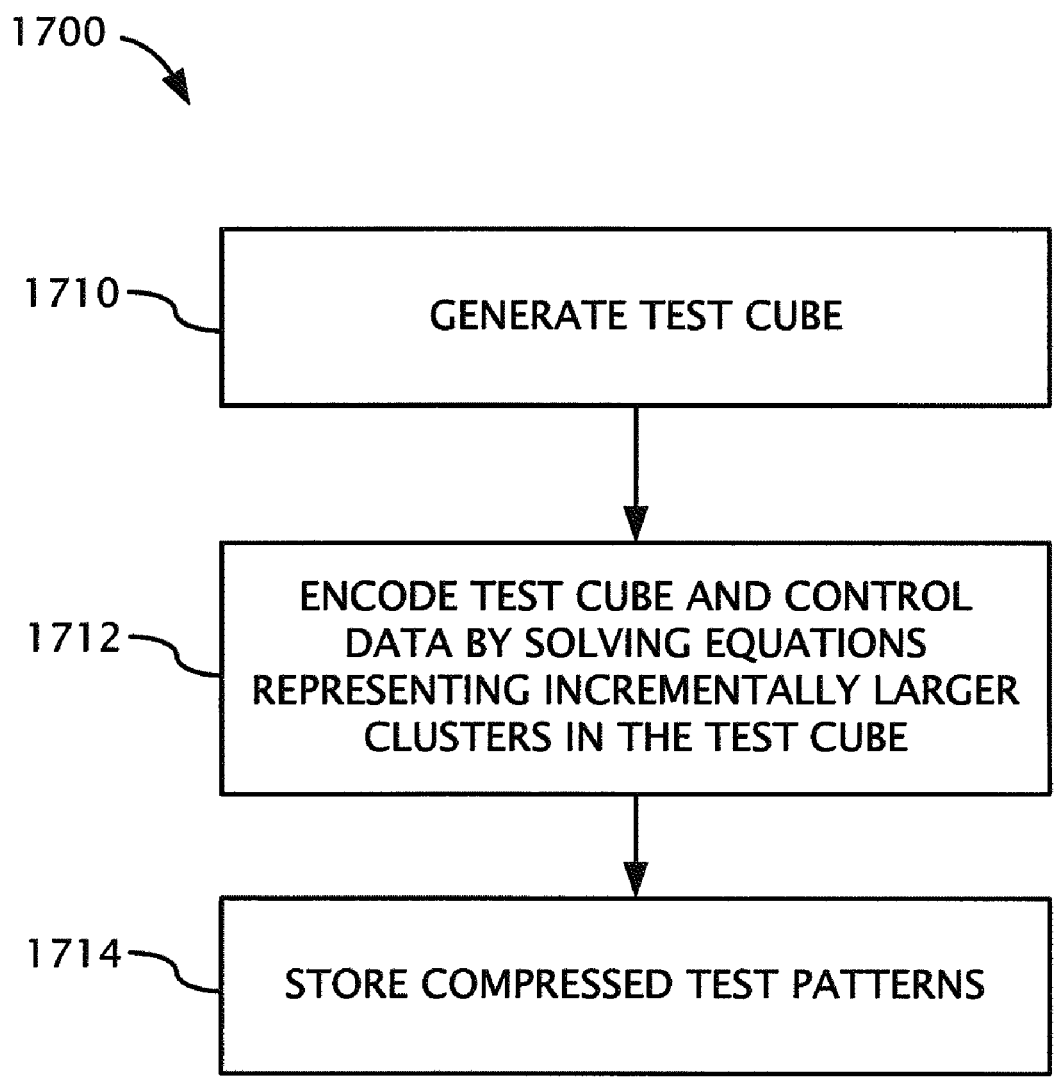
FIG. 17 is a flow chart showing another exemplary technique for generating compressed test patterns for low power decompressors, such as the decompressor illustrated in FIG. 13.

In some embodiments, the test pattern encoding process involves using equations that represent both the specified test pattern bits to be generated and the control data. FIG. 17 is a flow chart showing an exemplary encoding process for a decompressor architecture as shown in FIG. 13.

At process block 1710, a test cube is generated. The test cube can be generated using a variety of well-known ATPG techniques and can target a variety of possible faults (e.g., stuck-at faults, transition faults, and the like). The generated test cube typically comprises specified test pattern bits targeting one or more faults of the circuit-under-test and unspecified bits (the "don't care" bits).

At process block 1712, the test cube is encoded by solving equations (e.g., linear equations) representing incrementally larger clusters in the test cube. Gauss-Jordan elimination techniques can be used, for example, to solve the equations. In contrast to the embodiment discussed above with respect to FIG. 14, the equations considered at process block 1712 include equations representative of the desired control data for operating the shadow register. Similar to the embodiment of FIG. 14, however, encoding in certain embodiments begins with an equation representing a cluster comprising the one or more clock cycles of the test cube to be applied first and up to the first shift cycle having specified bits. The process incrementally adds specified bits from the later shift cycles, gradually progressing toward the other end of the test cube. As long as the solver can compress the specified bits in the cluster, the process continues by repeatedly increasing the size of the cluster, adding a new equation for each new specified bit not yet encoded, and invoking the solver again. At some point, a solution may not exist. When a solution cannot be found, and in certain embodiments, this particular time frame is assigned to a new cluster and the procedure is repeated for the new cluster. As a result of this process, the overall number of clusters used to cover the test cube can be reduced.

At process block 1714, the compressed test patterns (e.g., the variable seeds causing the ring generate to output the desired states) are stored in one or more computer-readable media. Because the control data is encoded into the compressed test patterns in this embodiment, the control data is not separately stored.

An exemplary embodiment for forming and solving equations representative of specified test bits and control data, such as may be performed at process block 1712, is described in the following paragraphs. In this exemplary embodiment, the compressed test patterns are determined by treating the bits of the compressed test patterns as Boolean variables while the scan cells are conceptually filled with symbolic expressions that are linear functions of input variables injected into the decompressor. For instance, consider a 2-input, 8-bit decompressor using the primitive polynomial $x^8+x^6+x^3+x^2+1$ and feeding 16 scan chains through a phase shifter having the following outputs:

| | | | |
|---|---|---|---|
| $s_0 \oplus s_3 \oplus s_4,$ | $s_2 \oplus s_5 \oplus s_7,$ | $s_0 \oplus s_6 \oplus s_7,$ | $s_2 \oplus s_5 \oplus s_6,$ |
| $s_0 \oplus s_2 \oplus s_5,$ | $s_1 \oplus s_3 \oplus s_7,$ | $s_3 \oplus s_4 \oplus s_6,$ | $s_1 \oplus s_5 \oplus s_6,$ |
| $s_3 \oplus s_4 \oplus s_7,$ | $s_4 \oplus s_5 \oplus s_7,$ | $s_0 \oplus s_1 \oplus s_3,$ | $s_0 \oplus s_5 \oplus s_7,$ |
| $s_0 \oplus s_4 \oplus s_5,$ | $s_3 \oplus s_4 \oplus s_5,$ | $s_3 \oplus s_5 \oplus s_7,$ | $s_1 \oplus s_5 \oplus s_7.$ |

Figure 18:
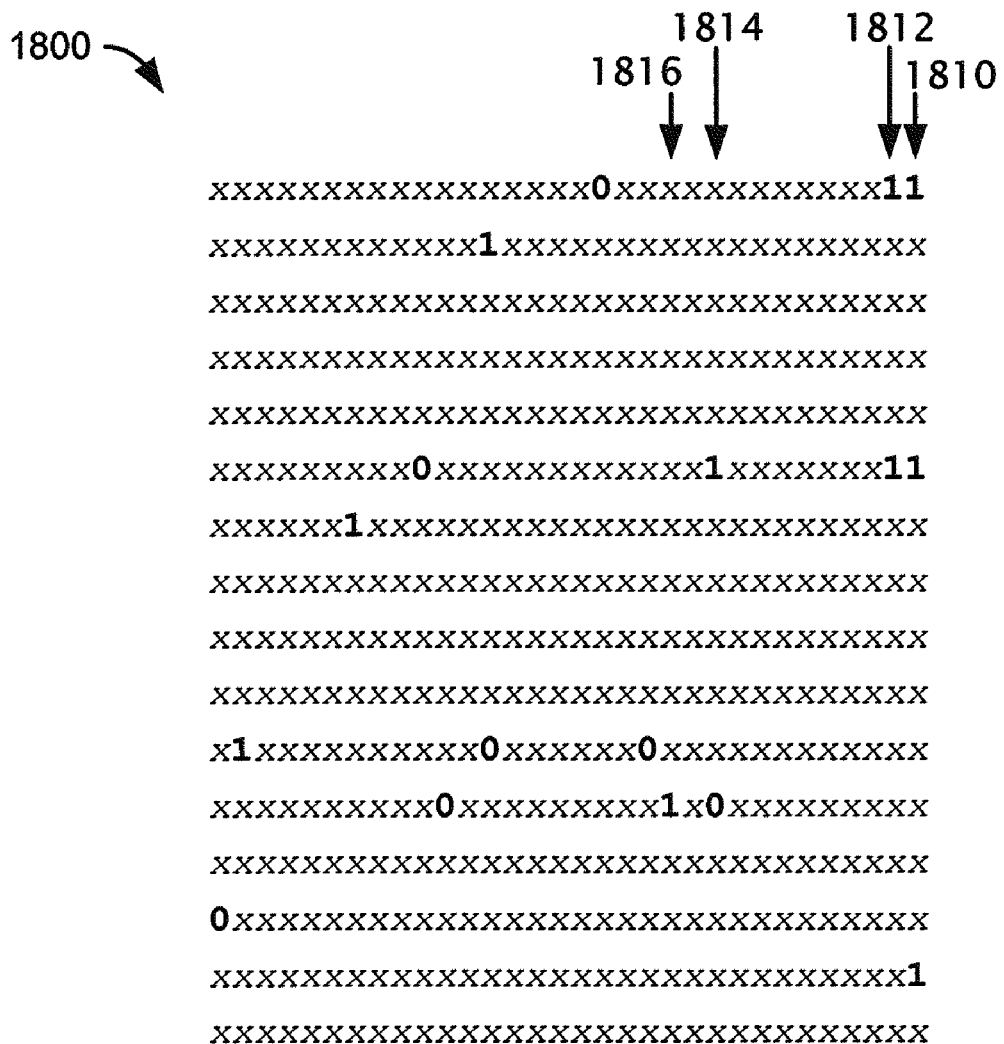
FIG. 18 is a diagram of a second exemplary test cube having specified bits and unspecified bits.

Also consider test cube 1800 shown in FIG. 18 and assume that the decompressor is to generate the test cube 1800. For purposes of this example, the "x"s in FIG. 18 denote "don't care" positions and the scan chains are loaded from the left so that the rightmost column in test cube 1800 represents the first set of test pattern bits to be loaded into the scan chains.

The input variables $a_0, b_0, a_1, b_1 \ldots$, of the exemplary decompressor are provided in pairs in such a way that continuous operation of the decompressor yields the following linear expressions for the specified bits located in the rightmost column (assume also that the decompressor initiation period takes four clock cycles):

$$a_0+a_1+a_2+b_3=1$$

$$a_1+b_2=1$$

$$a_1+a_3+b_0+b_2=1$$

$$a_4+b_4=1$$

The first three equations correspond directly to the three specified bits of the rightmost slice (slice 1810), whereas the last equation represents the control bit that causes the shadow register to store the content of the ring generator before the variables $a_4, b_4$ change the state of the generator during the fifth cycle. Thus, in contrast to the encoding approach used for conventional EDT, an additional equation is introduced into the encoding procedure representing the value of the bit used to control the shadow register. The above set of equations has a solution that determines the content of other scan cells as well.

In certain desirable embodiments, the same scan cell content is used to cover as many subsequent slices as possible. Thus, in certain embodiments and as explained above, the encoding process incrementally adds specified bits from the later shift cycles, gradually progressing toward the other end of the test cube. For instance, with respect to the test cube 1800 in FIG. 18, the next slice having specified bits (slice 1812) does not pose any encoding problems as it features two specified bits both on locations identical to those of the previous slice. Due to this match, no new equations need to be added to the former set. Instead, in certain embodiments of the disclosed technology, the only equation that is included for the second slice 1812 is the equation used to control the shadow register. Because there is no need to reload the shadow register during the second slice, this equation assumes the form $a_5+a_5=0$. By contrast, the conventional EDT test pattern compression technique solves an equation for every specified bit in the test cube.

The next slice of interest in the test cube 1800 (slice 1814) features two specified bits. In particular embodiments of the encoding procedure, only one new equation is introduced corresponding to the specified bits. In particular, only an equation representing the specified bit set to "0" is introduced because the other specified bit (the bit set to "1") is located in the same chain as two previously specified "1"s. Furthermore, in particular embodiments of the disclosed technology, the equation for the bit specified to "0" is desirably expressed in terms of variables injected during the first through fourth cycles. This is because a ring generator state which is to cover the indicated bits should be completely determined before the ring generator state is loaded into the shadow register on the falling edge of the fourth cycle (just before the decompressor starts feeding the scan chains in the fifth cycle). Thus, by conceptually moving this particular specified bit to the beginning of the cluster, an equation having the following form can be obtained: $a_3+b_0+b_2+b_3=0$. In certain embodiments, this equation is further accompanied by 8 control equations indicating that there is no need to update the shadow register during the corresponding shift cycles:

$$a_k+b_k=0, k=6,\ldots,13.$$

The next slice having a specified test pattern bit (slice 1816) has a conflict with the previous slices. Thus, according to certain embodiments of the disclosed technology, the encoding technique begins a new cluster with the shadow register being reloaded. A new cluster can also be generated whenever the solver fails to encode a given slice. In certain embodiments, the remaining unspecified slices of the previous cluster receive control equations similar to the ones shown above and used to control the shadow register so that it does not update during the corresponding shift cycle.

Figure 19:
FIG. 19 is a diagram of a test pattern corresponding to the test cube of FIG. 18 and generated using an embodiment of a low power decompressor as disclosed herein.

Embodiments of this exemplary technique can help generate large clusters that reduce the number of transitions during scan chain loading. For instance, the resultant low power fill for the test cube 1800 is shown as test pattern 1900 in FIG. 19. The corresponding switching rate for this test pattern is equal to 2.77%. By contrast, the switching rate for the same test cube encoded using the conventional EDT test pattern compression technique is 48.29%.

Experimental Results

Monte Carlo simulations were run to analyze an embodiment of the disclosed low power test pattern compression scheme as described above with respect to FIG. 17. The reported results (shown in Table 3) were obtained for a 32-bit decompressor controlled by 8 inputs driving 100 scan chains, each 500 bits long. Locations and values of the specified bits in successive test cubes were generated randomly. The resultant fill rate is listed in the first column of Table 3.

TABLE 3

Weighted transitions (%) vs. inputs & fill rates

| Fill rate | Number of inputs | | | | | | | |
|---|---|---|---|---|---|---|---|---|
| | 1 | 2 | 3 | 4 | 5 | 6 | 7 | 8 |
| 0.1 | 0.08 | 0.08 | 0.08 | 0.08 | 0.08 | 0.08 | 0.08 | 0.08 |
| 0.2 | 0.30 | 0.30 | 0.30 | 0.30 | 0.30 | 0.30 | 0.30 | 0.30 |
| 0.4 | 1.38 | 0.86 | 0.87 | 0.86 | 0.86 | 0.86 | 0.86 | 0.86 |
| 0.6 | — | 1.42 | 1.42 | 1.42 | 1.42 | 1.42 | 1.42 | 1.42 |
| 0.8 | — | 2.01 | 2.01 | 2.01 | 2.00 | 2.01 | 2.01 | 2.01 |
| 1.0 | — | 2.61 | 2.59 | 2.59 | 2.58 | 2.58 | 2.58 | 2.59 |
| 1.2 | — | 3.40 | 3.15 | 3.15 | 3.15 | 3.15 | 3.15 | 3.15 |
| 1.4 | — | 5.08 | 3.75 | 3.74 | 3.74 | 3.74 | 3.74 | 3.74 |
| 1.6 | — | — | 4.31 | 4.30 | 4.29 | 4.29 | 4.29 | 4.30 |
| 1.8 | — | — | 4.92 | 4.88 | 4.88 | 4.88 | 4.88 | 4.88 |
| 2.0 | — | — | 5.62 | 5.48 | 5.47 | 5.47 | 5.47 | 5.47 |
| 2.2 | — | — | 6.62 | 6.03 | 6.02 | 6.01 | 6.01 | 6.02 |
| 2.4 | — | — | 8.40 | 6.64 | 6.62 | 6.62 | 6.61 | 6.61 |
| 2.6 | — | — | 12.35 | 7.24 | 7.19 | 7.19 | 7.18 | 7.19 |

As can be seen in Table 3, the weighted transition metric (1) was virtually independent of the number of decompressor external channels. As expected, the value of the metric increased with the increasing fill rate. Furthermore, in all examined cases, the switching activity was significantly lower than the reference values obtained using the conventional EDT scheme (which are shown below in Table 4).

The next group of experiments was aimed at testing an embodiment of the low power decompression scheme on several industrial benchmarks. Results of these experiments are presented for circuits ranging in size from 220K to 10.5M gates. For each design, EDT with different compression levels and a d-bit decompressor having c external channels were used. Results of the experiments are summarized in Table 4. In addition to the number of gates, scan chains, patterns, and fill rates, Table 4 includes three sections where the following data is presented for each examined case: the switching rates as defined by Expression (1) for the standard embedded deterministic test ("SDT") and for an embodiment of the disclosed low power compression scheme ("LP") (corresponding to FIG. 17); the peak scan-in switching (obtained as a maximum value, over all test patterns, of a toggling rate measured during the last scan shift cycle); and the effective compression for the standard EDT and the exemplary embodiment of the low power compression scheme (the compression is defined as a ratio of the number of scan cells and the number of test data bits necessary to compress a test cube averaged over all test patterns).

As can be seen from Table 4, in all examined cases a substantial reduction in the total number of transitions was achieved, even when a single input channel was deployed. These results remain consistent with the simulation estimates presented in Table 3. For the sake of further comparison, the column "limit" reports a theoretical lower bound on the switching activity in each case. Those numbers were obtained by using the weighted transition metric (1) and assuming that an optimal fill was fed to all scan chains to trigger transitions only between two consecutive specified bits provided they have different values.

If a tester offers a "repeat the last pattern" functionality, the resultant compression can be higher than the ratio of scan chains to input channels. Results from using such techniques are reported in the two rightmost columns of Table 4. The reduction of test data volume using the "repeat the last pattern" functionality depends primarily on the number of different c-bit patterns. Additional post-processing can be used to identify the adjacent patterns which might be identical. If found, the patterns can be replaced by copies of themselves accompanied by a counter indicating how many times each respective copy should be applied. This quantity is taken into account by including the number of bits needed to encode the counter value. This technique was used to estimate the compression for both the conventional EDT and the exemplary low power compression embodiment. As can be seen from the rightmost columns in Table 4, test data compression was actually higher in many cases when using the exemplary embodiment of the disclosed low power scheme.

The generation of test patterns using embodiments of the low power techniques described herein typically reduces the degree of randomness observed in the scan chains. Thus, embodiments of the disclosed low power technique may produce more test patterns than the standard EDT technique in order to achieve the same desired test coverage. For instance, the increase in pattern count in the case of design D1 (Table 4) was equal to 13.55%, 5.28%, 3.64%, and 1.15% for 50, 100, 200 and 400 scan chains, respectively.

Furthermore, for the experiments presented in Table 4, the bridging coverage estimate ("BCE") was used to assess test coverage with respect to bridging defects when applying original EDT test patterns and applying test patterns generated using an embodiment of the low power test pattern generation technique described above. This metric allows one to estimate the impact of low power stimuli on detection of unmodeled defects. This metric was derived from data indicating how many times each stuck-at fault was detected according to Expression (6). For design D1, the differences between the BCE from using original EDT test patterns and test patterns generated using an embodiment of the disclosed low power test pattern generation techniques having the same stuck-at fault coverage were −0.63%, −0.4%, −0.29%, and −0.22%, depending on the scan chains configuration.

TABLE 4

Experimental Results

| Design | Gates | Scan chains | d | c | Tests | Fill rate (%) | Switching (%) | | Peak switching (%) | | Compression (x) | |
|---|---|---|---|---|---|---|---|---|---|---|---|---|
| | | | | | | | SDT | LP | Limit | STD | LP | SDT | LP |
| D1 | 220K | 50 × 252 | 48 | 1 | 5378 | 0.26 | 35.40 | 1.34 | 0.06 | 50.89 | 6.87 | 211.10 | 250.39 |
| | | 100 × 126 | 48 | 1 | 5378 | 0.26 | 39.10 | 2.69 | 0.06 | 51.01 | 11.54 | 251.10 | 283.52 |
| | | 200 × 63 | 48 | 2 | 5378 | 0.26 | 36.96 | 4.48 | 0.05 | 50.47 | 17.39 | 221.66 | 226.70 |
| | | 400 × 32 | 48 | 2 | 5378 | 0.26 | 40.94 | 7.76 | 0.05 | 49.49 | 31.12 | 283.72 | 276.00 |
| D2 | 220K | 50 × 252 | 48 | 4 | 1733 | 1.21 | 46.27 | 5.61 | 0.32 | 50.70 | 23.87 | 30.42 | 35.13 |
| | | 100 × 126 | 48 | 8 | 1735 | 1.22 | 46.82 | 11.10 | 0.33 | 50.38 | 37.10 | 21.48 | 26.13 |
| | | 200 × 63 | 64 | 12 | 1730 | 1.20 | 45.61 | 16.26 | 0.30 | 50.09 | 42.15 | 21.06 | 24.10 |
| | | 400 × 32 | 64 | 24 | 1732 | 1.21 | 45.08 | 24.58 | 0.27 | 49.45 | 48.63 | 17.35 | 19.67 |

TABLE 4-continued

Experimental Results

| Design | Gates | Scan chains | d | c | Tests | Fill rate (%) | Switching (%) SDT | Switching (%) LP | Limit | Peak switching (%) STD | Peak switching (%) LP | Compression (x) SDT | Compression (x) LP |
|---|---|---|---|---|---|---|---|---|---|---|---|---|---|
| D3 | 1M | 50 × 1404 | 48 | 2 | 28328 | 0.24 | 34.19 | 0.44 | 0.02 | 50.39 | 1.81 | 332.40 | 944.74 |
|  |  | 100 × 702 | 32 | 4 | 28328 | 0.24 | 28.99 | 0.71 | 0.01 | 50.52 | 3.56 | 257.28 | 629.45 |
|  |  | 200 × 351 | 48 | 8 | 28328 | 0.24 | 34.24 | 0.89 | 0.01 | 50.48 | 6.95 | 180.17 | 391.59 |
|  |  | 400 × 176 | 48 | 12 | 28328 | 0.24 | 33.08 | 2.19 | 0.01 | 49.82 | 13.80 | 156.02 | 290.75 |
| D4 | 1.1M | 100 × 752 | 32 | 4 | 10282 | 0.24 | 43.86 | 3.64 | 0.09 | 50.44 | 19.65 | 138.73 | 145.38 |
|  |  | 200 × 376 | 48 | 4 | 10246 | 0.23 | 43.30 | 6.06 | 0.08 | 50.33 | 27.75 | 166.22 | 165.73 |
|  |  | 400 × 188 | 48 | 8 | 10274 | 0.23 | 43.70 | 10.72 | 0.09 | 50.07 | 42.46 | 113.45 | 117.63 |
|  |  | 800 × 94 | 48 | 8 | 9998 | 0.21 | 43.73 | 16.21 | 0.07 | 50.09 | 48.40 | 162.67 | 166.93 |
| D5 | 2.7M | 50 × 2763 | 32 | 2 | 63593 | 0.04 | 36.25 | 0.24 | 0.01 | 50.45 | 1.67 | 780.02 | 1008.21 |
|  |  | 100 × 1382 | 32 | 2 | 63593 | 0.04 | 34.77 | 0.45 | 0.01 | 50.24 | 3.07 | 850.09 | 1118.30 |
|  |  | 200 × 691 | 32 | 2 | 63593 | 0.04 | 39.53 | 0.80 | 0.01 | 50.22 | 5.01 | 935.60 | 1229.68 |
|  |  | 400 × 346 | 32 | 2 | 63593 | 0.04 | 37.35 | 1.34 | 0.01 | 50.26 | 9.16 | 1081.05 | 1385.58 |
|  |  | 800 × 173 | 32 | 4 | 63593 | 0.04 | 39.65 | 2.45 | 0.01 | 50.14 | 17.10 | 758.49 | 1076.66 |
| D6 | 10.5M | 100 × 3085 | 32 | 2 | 21009 | 0.11 | 42.46 | 2.00 | 0.04 | 50.31 | 6.35 | 381.46 | 383.69 |
|  |  | 200 × 1543 | 32 | 4 | 21016 | 0.11 | 45.27 | 3.97 | 0.05 | 50.26 | 11.22 | 263.64 | 274.55 |
|  |  | 400 × 772 | 32 | 4 | 21014 | 0.11 | 46.48 | 5.74 | 0.04 | 50.22 | 19.36 | 302.94 | 321.61 |
|  |  | 800 × 386 | 32 | 8 | 21015 | 0.11 | 46.94 | 9.58 | 0.04 | 50.16 | 30.04 | 203.21 | 228.98 |

Exemplary Computing Environments

Figure 20:
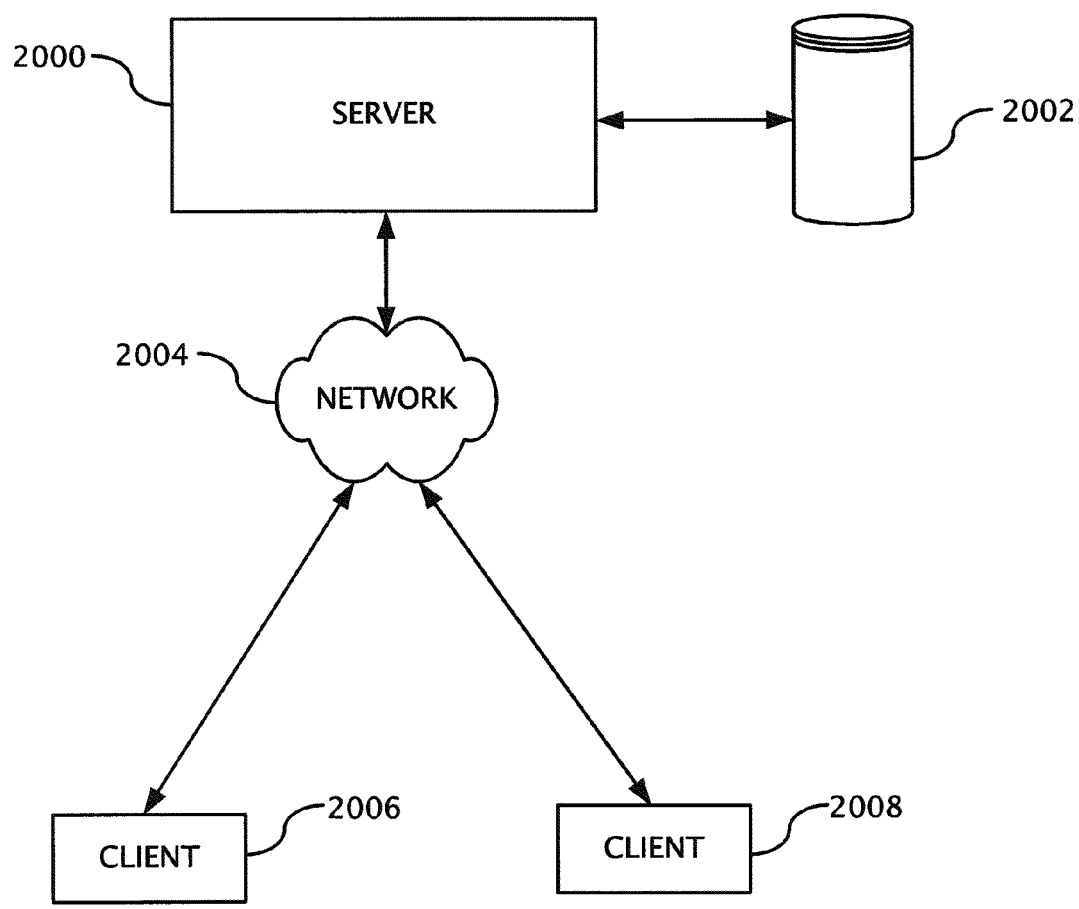
FIG. 20 is a schematic block diagram of a first distributed computer network as may be used to perform any of the disclosed methods.

Any of the aspects of the technology described above may be performed using a distributed computer network. FIG. 20 shows one suitable exemplary network. A server computer 2000 can have an associated storage device 2002 (internal or external to the server computer). For example, the server computer 2000 can be configured to generate compressed test patterns using any of the disclosed methods (for example, as part of an EDA software tool, such as a test pattern generation tool). The server computer 2000 can be coupled to a network, shown generally at 2004, which can comprise, for example, a wide-area network, a local-area network, a client-server network, the Internet, or other suitable network. One or more client computers, such as those shown at 2006, 2008, may be coupled to the network 2004 using a network protocol. The work may also be performed on a single, dedicated workstation, which has its own memory and one or more CPUs.

Figure 21:
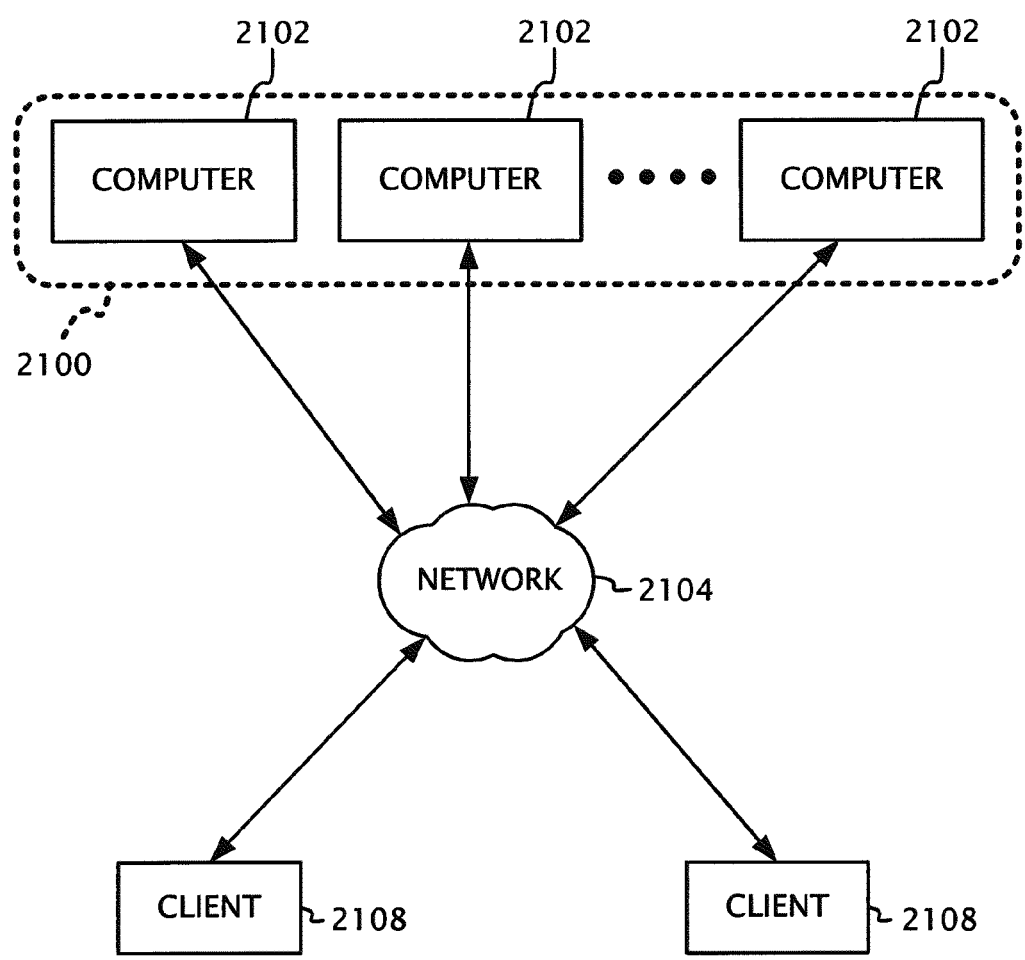
FIG. 21 is a schematic block diagram of a second distributed computer network as may be used to perform any of the disclosed methods.

FIG. 21 shows another exemplary network. One or more computers 2102 communicate via a network 2104 and form a computing environment 2100 (for example, a distributed computing environment). Each of the computers 2102 in the computing environment 2100 can be used to perform at least a portion of the compressed test pattern generation process. The network 2104 in the illustrated embodiment is also coupled to one or more client computers 2108.

Figure 22:
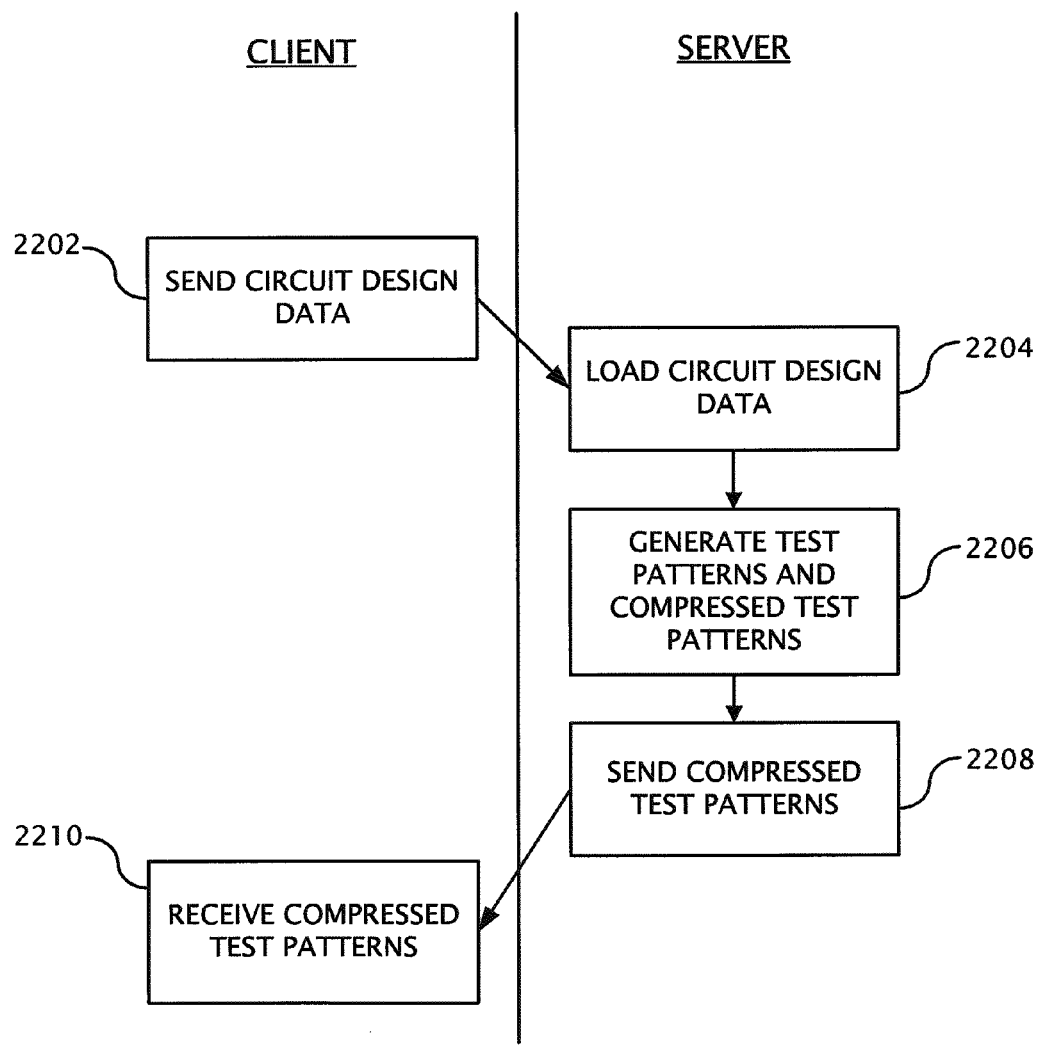
FIG. 22 is a flowchart showing one exemplary method of using the network of FIG. 20 or the network of FIG. 21 to generate low power test patterns.

FIG. 22 shows that design information for a circuit-under-test (for example, an HDL file, netlist, GDSII file, Oasis file, or other suitable design file representing the circuit-under-test together with its scan chains) can be analyzed using a remote server computer (such as the server computer 2000 shown in FIG. 20) or a remote computing environment (such as the computing environment 2100 shown in FIG. 21) in order to generate test patterns, compressed test patterns, or decompressor architectures according to any embodiment of the disclosed technology. At process block 2202, for example, the client computer sends the integrated circuit design information to the remote server or computing environment. In process block 2204, the integrated circuit design information is received and loaded by the remote server or by respective components of the remote computing environment. In process block 2206, test pattern and compressed test pattern generation is performed according to any of the disclosed embodiments. At process block 2208, the remote server or computing environment sends the resulting compressed test patterns to the client computer, which receives the data at process block 2210.

It should be apparent to those skilled in the art that the example shown in FIG. 2200 is not the only way to generate test patterns or compressed test patterns using multiple computers. For instance, the CUT design information may be stored on a computer-readable medium that is not on a network and that is sent separately to the server or computing environment (for example, a CD-ROM, DVD, or portable hard drive). Or, the server computer or remote computing environment may perform only a portion of the test pattern generation procedure.

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. An apparatus, comprising:
   a linear finite state machine (LFSM) having two or more LFSM outputs and one or more LFSM inputs;
   a register comprising two or more register inputs and two or more register outputs, the two or more register inputs being respectively coupled to the two or more LFSM outputs; and
   a phase shifter comprising two or more phase shifter inputs and two or more phase shifter outputs, the two or more phase shifter inputs being respectively coupled to the two or more register outputs.

2. The apparatus of claim 1, further comprising a control channel coupled to a clock input of the register.

3. The apparatus of claim 2, wherein the control channel is coupled to the clock input of the shadow register via a logic gate.

4. The apparatus of claim 3, wherein the logic gate is an AND gate.

5. The apparatus of claim 2, wherein the control channel receives input from a single pin of the circuit-under-test.

6. The apparatus of claim 2, wherein the control channel is coupled to one or more logic gates, the logic gates being coupled to one or more test data inputs of the circuit-under-test.

7. The apparatus of claim 1, wherein the logic gates form an XOR network.

8. The apparatus of claim 1, wherein the LFSM is a linear feedback shift register (LFSR) or a ring generator.

9. The apparatus of claim 1, wherein the register is a first register, the apparatus further comprising a second register comprising two or more second register inputs and two or more second register outputs, the two or more second register inputs being respectively coupled to two or more additional LFSM outputs, and the two or more second register outputs being respectively coupled to two or more additional phase shifter inputs.

10. The apparatus of claim 1, wherein the register is a first register and the phase shifter is a first phase shifter, the apparatus further comprising:
a second register comprising two or more second register inputs and two or more second register outputs, the two or more second register inputs being respectively coupled to two or more additional LFSM outputs; and
a second phase shifter comprising two or more second phase shifter inputs and two or more second phase shifter outputs, the two or more second phase shifter inputs being respectively coupled to the two or more second register outputs.

11. One or more non-transitory computer-readable storage devices storing design data for implementing an apparatus, the apparatus comprising:
a linear finite state machine (LFSM) having two or more LFSM outputs and one or more LFSM inputs;
a register comprising two or more register inputs and two or more register outputs, the two or more register inputs being respectively coupled to the two or more LFSM outputs; and
a phase shifter comprising two or more phase shifter inputs and two or more phase shifter outputs, the two or more phase shifter inputs being respectively coupled to the two or more register outputs.

12. The one or more non-transitory computer-readable storage devices of claim 11, wherein the circuit design information further defines a control channel coupled to a clock input of the register.

13. The one or more non-transitory computer-readable storage devices of claim 11, wherein the logic gates form an XOR network.

14. The one or more non-transitory computer-readable storage devices of claim 11, wherein the LFSM is a linear feedback shift register (LFSR) or a ring generator.

15. The one or more non-transitory computer-readable storage devices of claim 11, wherein the register is a first register, and wherein the circuit design information further defines a second register comprising two or more second register inputs and two or more second register outputs, the two or more second register inputs being respectively coupled to two or more additional LFSM outputs, and the two or more second register outputs being respectively coupled to two or more additional phase shifter inputs.

16. One or more non-transitory computer-readable storage devices storing computer-executable instructions which when executed will cause a computer system to perform a method, the method comprising:
generating circuit design information for decompression circuitry, the circuit design information defining:
a linear finite state machine (LFSM) having two or more LFSM outputs and one or more LFSM inputs;
a register comprising two or more register inputs and two or more register outputs, the two or more register inputs being respectively coupled to the two or more LFSM outputs; and
a phase shifter comprising two or more phase shifter inputs and two or more phase shifter outputs, the two or more phase shifter inputs being respectively coupled to the two or more register outputs.

17. The one or more non-transitory computer-readable storage devices of claim 16, wherein the control channel is coupled to the clock input of the shadow register via a logic gate.

18. The one or more non-transitory computer-readable storage devices of claim 16, wherein the control channel is configured to receive input from a single pin.

19. The one or more non-transitory computer-readable storage devices of claim 16, wherein the control channel is coupled to one or more logic gates, the logic gates being coupled to one or more test data inputs of the circuit-under-test.

20. The one or more non-transitory computer-readable storage devices of claim 16, wherein the register is a first register and the phase shifter is a first phase shifter, and wherein the circuit design information further defines:
a second register comprising two or more second register inputs and two or more second register outputs, the two or more second register inputs being respectively coupled to two or more additional LFSM outputs; and
a second phase shifter comprising two or more second phase shifter inputs and two or more second phase shifter outputs, the two or more second phase shifter inputs being respectively coupled to the two or more second register outputs.

* * * * *